(12) United States Patent
Karunadasa et al.

(10) Patent No.: US 11,271,123 B2
(45) Date of Patent: Mar. 8, 2022

(54) ALLOYED HALIDE DOUBLE PEROVSKITES AS SOLAR-CELL ABSORBERS

(71) Applicant: The Board of Trustees of the Leland Stanford Junior University, Stanford, CA (US)

(72) Inventors: Hemamala Indivari Karunadasa, Palo Alto, CA (US); Adam H. Slavney, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 466 days.

(21) Appl. No.: 15/937,530

(22) Filed: Mar. 27, 2018

(65) Prior Publication Data

US 2018/0277696 A1 Sep. 27, 2018

Related U.S. Application Data

(60) Provisional application No. 62/477,101, filed on Mar. 27, 2017.

(51) Int. Cl.
*H01L 31/032* (2006.01)
*H01L 31/072* (2012.01)
(Continued)

(52) U.S. Cl.
CPC ........ *H01L 31/0321* (2013.01); *C01B 19/002* (2013.01); *C07F 9/94* (2013.01);
(Continued)

(58) Field of Classification Search
CPC ... H01L 51/4213; H01L 51/424; H01L 51/42; H01L 51/4206; H01L 51/447;
(Continued)

(56) References Cited

U.S. PATENT DOCUMENTS 7,148,417 B1 12/2006 Landis
9,391,287 B1 7/2016 Huang et al.
(Continued)

FOREIGN PATENT DOCUMENTS

AU 2013319979 A1 3/2015
WO 2014/045021 A1 3/2014
(Continued)

OTHER PUBLICATIONS

Hoefler, Sebastian F., et al. "Progress on Lead-Free Metal Halide Perovskites for Photovoltaic Applications: a Review." Monatshefte Fur Chemie—Chemical Monthly, vol. 148, No. 5, Mar. 8, 2017, pp. 795-826., doi: 10.1007/s00706-017-1933-9. (Year: 2017).*
(Continued)

*Primary Examiner* — Bethany L Martin
*Assistant Examiner* — Kourtney R S Carlson
(74) *Attorney, Agent, or Firm* — Kaplan Breyer Schwarz, LLP

(57) ABSTRACT

An alloyed halide double perovskite material, an alloyed halide double perovskite solar-cell absorber and solar cells constructed with such absorbers, the alloyed halide double perovskite material having the formula $A_2B_{1-a}B'_{1-b}D_xX_6$, where A is an inorganic cation, an organic cation, a mixture of inorganic cations, a mixture of organic cations, or a mixture of one or more inorganic cations and one or more organic cations, where B is a metal, a mixture of metals, a metalloid, a mixture of metalloids, any mixture thereof, or is a vacancy, where B' is a metal, a mixture of metals, a metalloid, a mixture of metalloids, any mixture thereof, or is a vacancy, where D is a dopant, and where X is a halide, a pseudohalide, a mixture of halides, a mixture of pseudohalides, or a mixture of halides and pseudohalides, and where x=a+b.

12 Claims, 14 Drawing Sheets

(51) Int. Cl.
  *H01L 51/44* (2006.01)
  *H01L 31/054* (2014.01)
  *C01B 19/00* (2006.01)
  *H01L 51/00* (2006.01)
  *C07F 9/94* (2006.01)
  *H01L 51/42* (2006.01)

(52) U.S. Cl.
  CPC ........ *H01L 31/0549* (2014.12); *H01L 31/072* (2013.01); *H01L 51/005* (2013.01); *H01L 51/009* (2013.01); *H01L 51/0077* (2013.01); *H01L 51/0079* (2013.01); *H01L 51/0091* (2013.01); *H01L 51/447* (2013.01); *H01L 51/42* (2013.01); *H01L 51/4253* (2013.01); *Y02E 10/52* (2013.01)

(58) Field of Classification Search
  CPC ......... H01L 31/0725; H01L 31/022425; H01L 31/032; H01L 31/02167; H01L 31/02363; H01L 31/0749; H01L 31/0326; H01L 31/0321
  See application file for complete search history.

(56) References Cited

U.S. PATENT DOCUMENTS

| | | | |
|---|---|---|---|
| 9,564,593 | B2 | 2/2017 | Karunadasa et al. |
| 2002/0081786 | A1 | 6/2002 | Toet et al. |
| 2002/0117199 | A1 | 8/2002 | Oswald |
| 2010/0051098 | A1 | 3/2010 | Sheng et al. |
| 2011/0132423 | A1 | 6/2011 | Joge et al. |
| 2011/0139227 | A1 | 6/2011 | Sivananthan et al. |
| 2011/0146755 | A1 | 6/2011 | Curran et al. |
| 2011/0162697 | A1 | 7/2011 | Sivananthan et al. |
| 2011/0232758 | A1 | 9/2011 | Khanarian et al. |
| 2011/0272012 | A1 | 11/2011 | Heng et al. |
| 2012/0017976 | A1 | 1/2012 | Nechache et al. |
| 2014/0290727 | A1 | 10/2014 | Yamamoto et al. |
| 2015/0053259 | A1 | 2/2015 | Hardin et al. |
| 2015/0249170 | A1 | 9/2015 | Snaith et al. |
| 2015/0303343 | A1 | 10/2015 | Kleimam et al. |
| 2016/0035927 | A1 | 2/2016 | Gershon et al. |
| 2016/0087233 | A1 | 3/2016 | Guha et al. |
| 2016/0133672 | A1 | 5/2016 | Koposov et al. |
| 2016/0163904 | A1 | 6/2016 | Mailoa et al. |
| 2016/0190377 | A1 | 6/2016 | Green |
| 2016/0307704 | A1 | 10/2016 | Hillhouse et al. |
| 2016/0351808 | A1 | 12/2016 | Luchinger et al. |
| 2017/0194101 | A1 | 7/2017 | Karunadasa et al. |
| 2017/0358398 | A1 | 12/2017 | Beaumont et al. |
| 2018/0290897 | A1* | 10/2018 | Snaith ................. H01L 51/0007 |
| 2018/0309077 | A1 | 10/2018 | Bush et al. |

FOREIGN PATENT DOCUMENTS

| | | | | |
|---|---|---|---|---|
| WO | 2015/017885 | A1 | 2/2015 | |
| WO | 2015/085441 | A1 | 6/2015 | |
| WO | 2017037448 | A1 | 3/2017 | |
| WO | WO-2017037448 | A1 * | 3/2017 | ........... C01G 30/006 |

OTHER PUBLICATIONS

Savory, Christopher N, et al. "Can Pb-Free Halide Double Perovskites Support High-Efficiency Solar Cells?" ACS Energy Letters, vol. 1, Oct. 12, 2016, pp. 949-955. (Year: 2016).*
Mosconi, Edoardo, et al. "Electronic and Optical Properties of Mixed Sn—Pb Organohalide Perovskites: a First Principles Investigation." Journal of Materials Chemistry A, vol. 3, No. 17, 2015, pp. 9208-9215., doi:10.1039/c4ta06230b. (Year: 2015).*
Hemamala Indivari Karunadasa et al., Related unpublished U.S. Appl. No. 15/397,565 entitled "Halide Double Perovskite Cs2AgBiBr6 Solar-Cell Absorber Having Long Carrier Lifetimes", filed on Jan. 3, 2017.
Stoumpos, Constantinos C., et al.; Semiconductng Tin and Lead Iodide Perovskites with Organic Cations: Phase Transitions, High Mobilities, and Near-Infrared Photoluminescent Properties; Inorg. Chem. 2013, 52, 9019-9038 (Year 2013).
Slavney, Adam H. et al.; A Bismuth-Halide Double Perovskite with Long Carrier Recombination Lifetime for Photovoltaic Applications; D. Am. Ohm. Soc., 2016, 138, 2138-2141 (Year: 2016).
Requirement for Restriction/Election received for French Application No. 15/769,287, dated Dec. 6, 2018, 11 pages.
Non-Final Rejection received for U.S. Appl. No. 15/397,565, dated Mar. 8, 2019, 15 pages.
Non-Final Rejection received for U.S. Appl. No. 14/958,587, dated Mar. 22, 2019, 25 pages.
GB Application No. 1515546.8, priority document for WO 2017/037448 A1; filed Sep. 2, 2015 (Year: 2015).
Advisory Action received for U.S. Appl. No. 15/397,565, dated Feb. 20, 2020, 3 pages.
Authorized Officer: Fratiloiu, Silvia, International Search Report and Written Opinion issued in PCT application No. PCT/US2017/051753, dated Nov. 29, 2017, 13 pp.
European Supplementary Search Report and Search Opinion Received for EP Application No. 16864751.9, dated Jun. 12, 2019, 8 pages.
Examination Report issued in related India Patent Application No. 201827017353 dated Dec. 30, 2019.
Extended European Search Report issued in EP patent application No. 16864751.9, dated Jun. 12, 2019, 8 pp.
Final Office Action received for U.S. Appl. No. 15/397,565, dated Nov. 6, 2019, 12 pages.
Non-Final Rejection received for U.S. Appl. No. 15/769,287, dated Apr. 4, 2019, 11 pages.
Notice of Allowance received for U.S. Appl. No. 14/958,587, dated Oct. 9, 2019, 13 pages.
Notice of Allowance received for U.S. Appl. No. 15/769,287, dated Aug. 29, 2019, 9 pages.
Yi Wei: "Synthesis and optical properties of self-assembled 2D layered orgnic-inorganic perovskites for optoelectronics". Thesis. ENS Cachan, Jul. 2012.
Todorov, et al.: "Perovskite—kesterite monolithic tandem solar cells with high open-circuit voltage." Applied Physics Letters, 105(17), 173902. (2014).
Tanaka et al: "Bandgap and exciton binding energies in lead-iodide-based natural quantum-well crystals". 2003. Science and technology or advanced materials, 4:6, 599-604.
Loper, et al.: "Organic-inorganic halide perovskites: Perspectives for silicon-based tandem solar cells." IEEE Journal of Photovoltaics, 4(6), 1545-1551. (2014).
Liu, et al.: "Efficient planar heterojunction perovskite solar cells by vapour deposition." Nature, 501 (7467), 395-398. (2013).
Lee et al.: "Efficient hybrid solar cells based on meso-superstructured organometal halide perovskites". Science 338, 643-647 (2012).
"Non-Final Office Action", issue in related U.S. Appl. No. 14/733,462, dated Mar. 10, 2016, 14 pages.
"Final Office Action", issued in related U.S. Appl. No. 14/733,462, dated Oct. 28, 2016, 28 pages.
"Notice of Allowance" issued in related U.S. Appl. No. 14/733,462, dated Nov. 21, 2016, 10 pages.
Colin D. Bailie et al., "High-efficiency tandem perovskite solar cells", https://web.stanford.edu/group/mcgehee/publications/MRS2015.pdf, "Mrs Bulletin", dated Aug. 1, 2015, vol. 40.
Authorized Officer: Lee W. Young, "International Search Report and Written Opinion" issued in related PCT Application No. PCT/US2016/058156, dated Apr. 19, 2017.
Authorized Officer: Lee W. Young, "International Search Report and Written Opinion" issued in related PCT App. No. PCT/US2015/063817 dated Mar. 22, 2016.

* cited by examiner

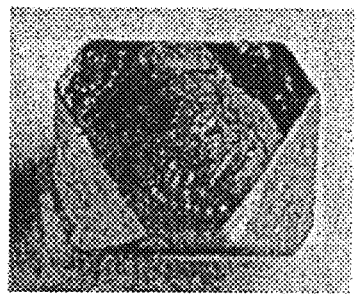 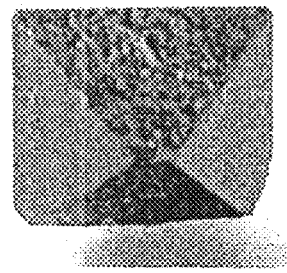
FIG. 5A
(PRIOR ART)
FIG. 5B

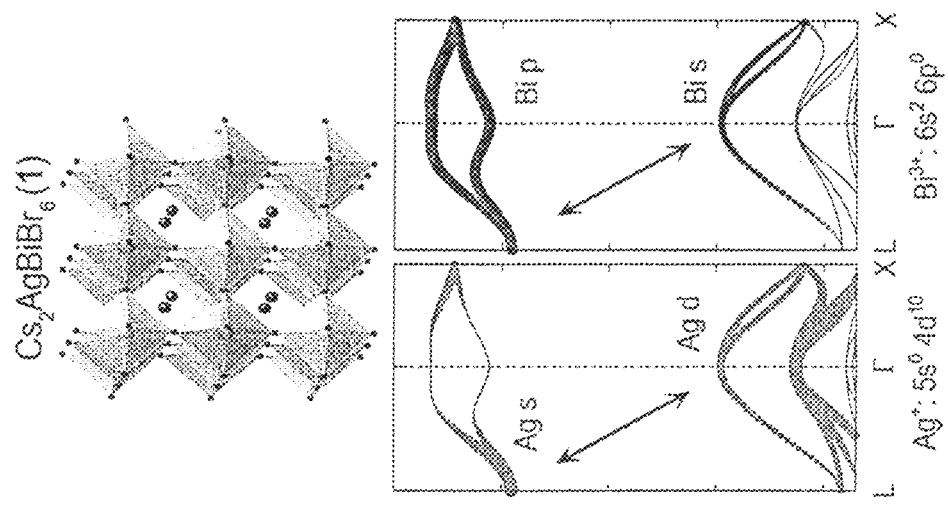
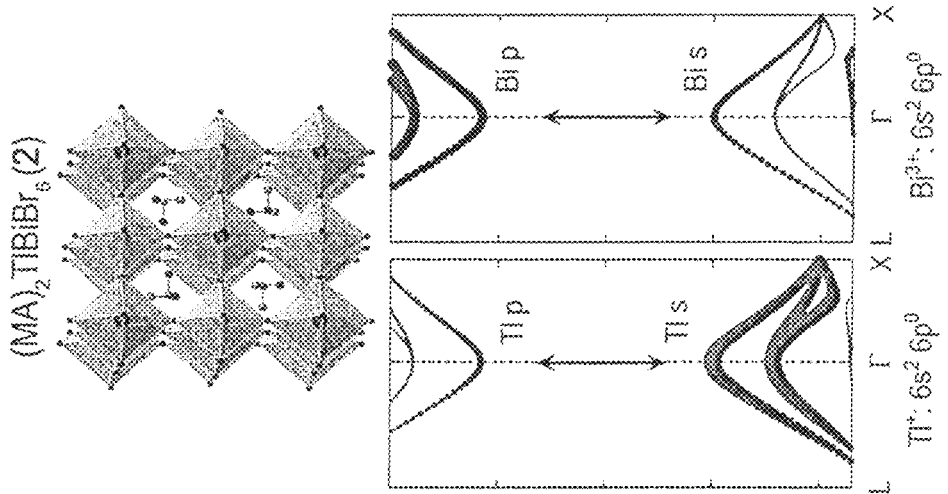
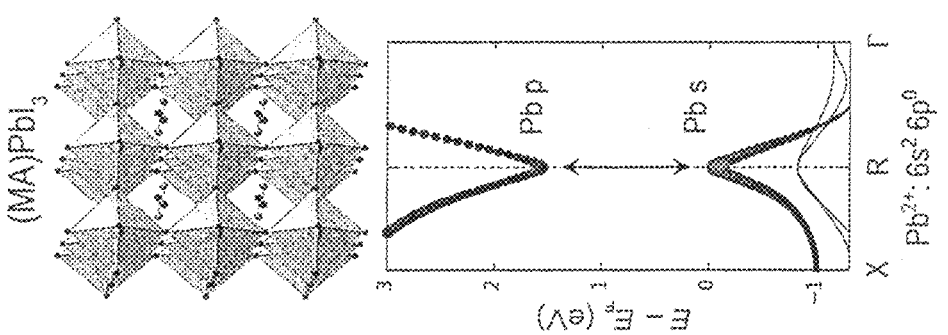
FIG. 6A (PRIOR ART)
FIG. 6B
FIG. 6C (PRIOR ART)

FIG. 14A
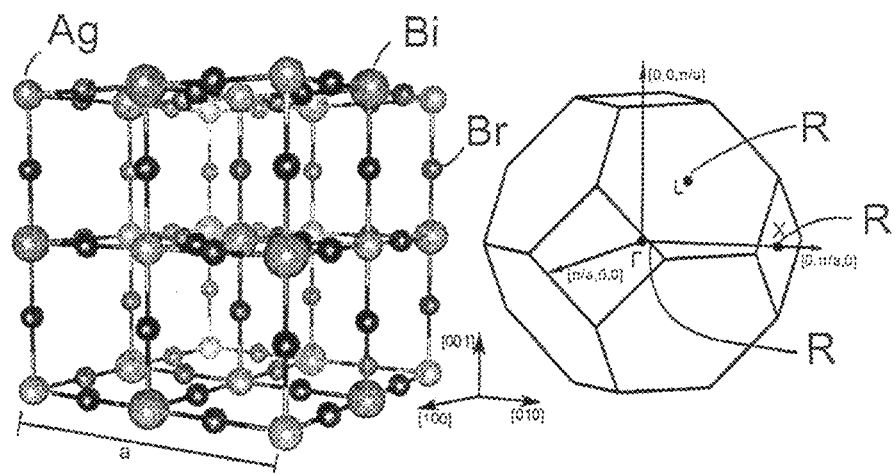
FIG. 14B
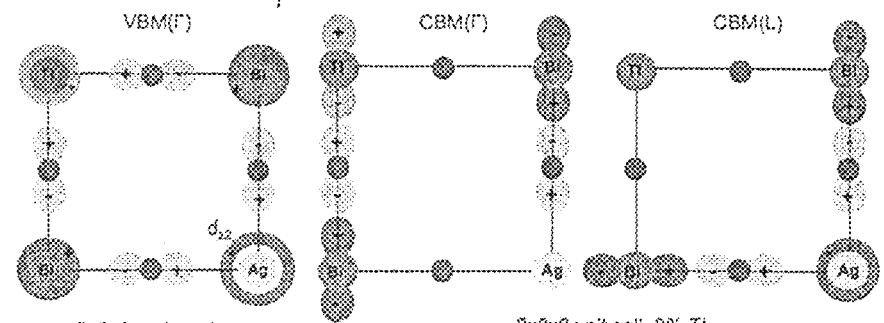
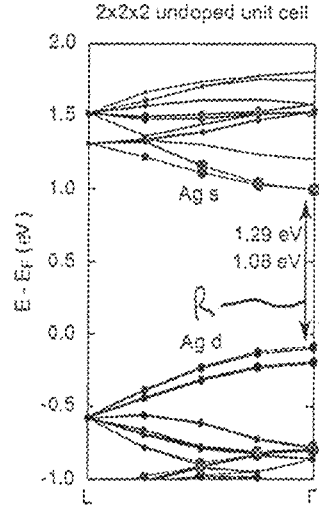
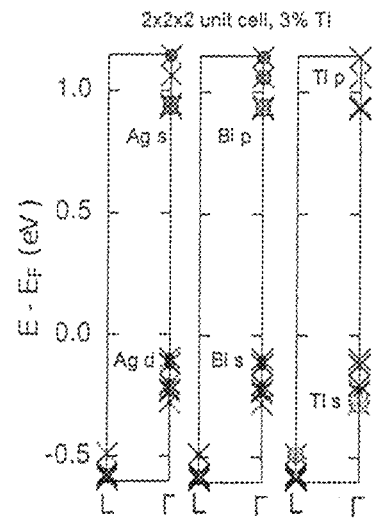
FIG. 14C  FIG. 14D

ALLOYED HALIDE DOUBLE PEROVSKITES AS SOLAR-CELL ABSORBERS

RELATED APPLICATIONS

This application claims the benefit of U.S. Provisional Application No. 62/477,101 filed on Mar. 27, 2017, which is incorporated herein by reference in its entirety.

STATEMENT REGARDING FEDERALLY SPONSORED RESEARCH OR DEVELOPMENT

This invention was made with Government support under contract DE-AC02-76SF00515 awarded by the Department of Energy. The Government has certain rights in the invention.

FIELD

The present disclosure relates to solid-state solar cells. More particularly, the present disclosure relates to an alloyed halide double perovskite material, an alloyed halide double perovskite solar-cell absorber and solar cells constructed with such absorbers.

BACKGROUND

Solid-state solar cells with halide perovskite absorbers have shown large improvements in power conversion efficiency over the last eight years and are now above 20%. This makes them competitive with many commercial technologies like polycrystalline silicon and CdTe.

Simple perovskite solar absorbers have several advantages. The perovskite material can be easily deposited from solution for low-cost manufacturing, they are made from cheap starting materials, and have a highly flexible framework which allows for control of materials properties.

Unfortunately, perovskite solar absorbers have several disadvantages. Specifically, most formulations of perovskite contain the $Pb^{2+}$ ion (e.g., $APbI_3$, $APbI_{3-x}Br_x$, and $APbBr_3$ where A is a monovalent cation (1+ ion) such as $CH_3NH_3^+$ (MA), $(H_2N)_2CH^+$, and $Cs^+$, which is toxic and water-soluble. The toxicity remains a critical concern for the material's large-scale manufacture and use. In addition, lead perovskite ($APbX_3$) materials (e.g., $APbI_3$ and $APbBr_3$) display poor stability to ambient humidity, heat, and light leading to short-lived photovoltaic devices.

A past attempt to create a less toxic and stable perovskite that mimics the electronic properties of the lead perovskite, involved replacing the $Pb^{2+}$ with the non-toxic, isoelectronic $Bi^{3+}$, by synthesizing a double perovskite $Cs_2AgBiBr_6$ (FIG. 5A), as disclosed in U.S. patent application Ser. No. 15/397,565 to Karunadasa et al. entitled "HALIDE DOUBLE PEROVSKITE $Cs_2AgBiBr_6$ SOLAR-CELL ABSORBER HAVING LONG CARRIER LIFETIMES," the entire disclosure of which is incorporated herein by reference. Solid $Cs_2AgBiBr_6$ is significantly more heat and moisture resistant than the lead perovskites (e.g., $(MA)APbI_3$). However, $Cs_2AgBiBr_6$'s large indirect bandgap of 1.95 eV provides weaker light absorption compared to the lead perovskites (e.g., $(MA)PbI_3$), which have direct gaps of ca. 1.6 eV.

Accordingly, a less toxic and stable double perovskite material having a lower bandgap and/or direct bandgap that captures the photophysical properties of $(MA)PbI_3$ is still needed.

SUMMARY

Disclosed herein is an alloyed double perovskite material comprising a formula $A_2B_{1-a}B'_{1-b}D_xX_6$, where A is an inorganic cation, an organic cation, a mixture of inorganic cations, a mixture of organic cations, or a mixture of one or more inorganic cations and one or more organic cations, where B is a metal, a mixture of metals, a metalloid, a mixture of metalloids, any mixture thereof, or is absent (a vacancy), where B' is a metal, a mixture of metals, a metalloid, a mixture of metalloids, any mixture thereof, or is absent (a vacancy), where D is a dopant, and where X is a halide or a mixture of halides and where x=a+b. More, specifically, component A of the double perovskite structure is an inorganic cation, such as but not limited to Li, Na, K, Rb, Cs, Ca, Sr, Ba, Ag, Tl, or any mixture thereof, an organic cation such as but not limited to $NH_4^+$, $(CH_3NH_3)^+$, $(CH(NH_2)_2^+)$, $(C(NH_2)_3^+)$, $CH_3CH_2NH_3$, $^+NH_3OH^+$, or any mixture thereof, or any mixture of one or more of the aforesaid inorganic cations and one or more of the aforesaid organic cations. Component B of the double perovskite structure is a metal, such as but not limited to, Li, Na, K, Rb, Cs, Cu, Ag, Au, Al, In, Tl, Ga, Bi, Se, Sn, Fe, Pb, Sc, Y, La, Ti, Zr, Hf, a lanthanide or any mixture thereof, a metalloid such as but not limited to As, Sb, Te, or any mixture thereof, or any mixture of one or more of the aforesaid metals and one or more of the aforesaid metalloids, or is absent (a vacancy). Component B' of the double perovskite structure is a metal, such as but not limited to, Li, Na, K, Rb, Cs, Cu, Ag, Au, Al, In, Tl, Ga, Bi, Se, Sn, Fe, Pb, Sc, Y, La, Ti, Zr, Hf, a lanthanide or any mixture thereof, a metalloid such as but not limited to As, Sb, Te, or any mixture thereof, or any mixture of one or more of the aforesaid metals and one or more of the aforesaid metalloids, or is absent (a vacancy). Component X of the double perovskite structure is a halide such as but not limited to F, Cl, Br, I, or any mixture thereof, a pseudohalide such as but not limited to $CN^-$, $SCN^-$, $OCN^-$, $NCS^-$, $SeCN^-$, $HCO_2^-$ or any mixture thereof, or a mixture of one or more of the aforesaid halides and one or more of the aforesaid pseudohalides. Component D, introduced into the double perovskite structure to alloy the structure, includes, but is not limited to Tl, In, Ga, Bi, Sb, As, Se, Te, Pb, Sn, Cu, Au, Zn, Cd, Hg, Sc, Y, Mn, Fe, K, Rb, Cs, Ca, Sr, Ba, La, Ti, Zr, Hf, Ag, Al, Ge, S, V, Nb, or any mixture thereof.

In one embodiment, the double perovskite can be $Cs_2AgBiBr_6$ and the alloying can be performed with a Thallium (Tl) dopant to produce the $Cs_2(Ag_{1-a}Bi_{1-b})Tl_xBR_6$ (x=a+b=0.003-0.075) material. The incorporation of dilute Tl impurities into $Cs_2AgBiBr_6$ during alloying, specifically, <1 atomic percent (atom %) of Tl, results in a large bandgap reduction. This reduction is controlled by the amount of Tl incorporated and provides access to materials with bandgaps of ca. 1.4 eV (ideal for a single-junction device as described further on in greater detail). Additionally the alloyed double perovskite displays μs (microsecond) carrier lifetimes, which allows for good charge extraction from the material. Although the carrier lifetime of $Cs_2(Ag_{1-a}Bi_{1-b})Tl_xBr_6$ (x=a+b=0.003-0.075) is reduced somewhat compared to $Cs_2AgBiBr_6$ it is still comparable to the best lead perovskite materials.

As with the host compound, $Cs_2AgBiBr_6$, the Tl-doped double perovskite is robust towards moisture and heat compared with $(MA)PbI_3$. This represents a significant improvement over the lead perovskites, which decompose upon exposure to moisture or heating.

Although Tl is estimated to be around 10 times more toxic than Pb, the small total amount of Tl used here (<1 atom %) means that, overall, the Tl-doped double perovskite has reduced toxicity compared with $(MA)PbI_3$.

Further disclosed herein is a solar cell comprising a solar-cell absorber layer comprising an alloyed halide double perovskite material.

Further disclosed herein is a solar cell comprising a solar-cell absorber layer comprising the alloyed halide double perovskite material.

Further disclosed herein is a solar cell device comprising at least first and second solar cells, the first and second solar cells mechanically stacked or monolithically integrated, wherein at least one of the first and second solar cells includes a solar-cell absorber layer comprising the alloyed halide double perovskite material.

Further disclosed herein is a solar cell device comprising first and second solar cells and a dichroic mirror, wherein at least one of the first and second solar cells includes a solar-cell absorber layer comprising the alloyed halide double perovskite material.

Further disclosed herein a solar absorber for a photovoltaic cell, the solar absorber comprising the alloyed halide double perovskite material.

BRIEF DESCRIPTION OF THE DRAWINGS

FIG. 5A is a photograph of a single crystal of $Cs_2AgBiBr_6$.

FIG. 5B is a photograph of a single crystal of $Cs_2(Ag_{1-a}Bi_{1-b})Tl_xBr_6$ (x=a+b=0.075).

FIGS. 6A-6C depict crystal structures and band structures of $(MA)PbI_3$ ($MA=CH_3NH_3^+$) (FIG. 6A), $(MA)_2TlBiBr_6$ (FIG. 6B), and $Cs_2AgBiBr_6$ (FIG. 6C). The band structures were calculated using DFT–PBE+SOC. The conduction band states are rigidly shifted to reproduce the experimental bandgap. The dominant metal orbital character of the bands is shown with thicker lines. The arrows show the direct (FIG. 6A and FIG. 6B) and indirect (FIG. 6C) bandgap transitions. In the primitive unit cell of $Cs_2AgBiBr_6$, the valence-band maximum (VBM) appears at X, however, in the conventional setting shown here, the VBM is at Γ due to band folding. Hydrogens and disordered atoms in MA are omitted for clarity.

FIG. 14A illustrates a conventional unit cell of $Cs_2AgBiBr_6$ with Ag atoms in silver, Bi atoms in orange and Br atoms in brown. Cs atoms are not shown. Brillouin zone of the Fm-3m space group with high-symmetry points Γ(0, 0, 0), X(π/a, 0, π/a), and L(π/a, π/a, π/a) marked with R.

FIG. 14B is a schematic illustration of the orbital character of the VBM at Γ and the CBM at Γ and L.

FIG. 14C are graphs showing the DFT–PBE+SOC band structure of the undoped 2×2×2 unit cell. Bands with Ag s character appear at Γ due to band folding. The energy differences corresponding to the indirect and direct band gap in the conventional unit cell are shown with arrows, R and B respectively.

FIG. 14D is a graph showing the bands at Γ and L of the Tl doped, 320-atom unit cell $(Cs_2(Ag_{1-a}Bi_{1-b})Tl_xBr_6$, x=0.03) shown as crosses. The orbital character of the bands is shown with circles.

FIG. 16A shows Ag orbital contributions, FIG. 16B shows Bi orbital contributions and FIG. 16C shows Tl orbital contributions with dots. Due to computational expense only the high symmetry k points Γ, X, and L were calculated.

DETAILED DESCRIPTION

Figure 1:
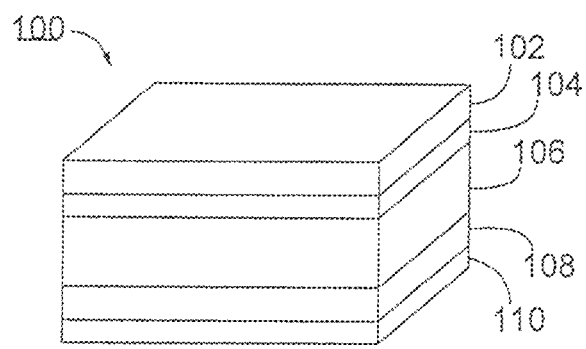
FIG. 1 is a schematic representation of a solid state solar cell according to an embodiment of the present disclosure.

FIG. 1 schematically represents a solid state single junction photovoltaic solar cell 100 according to an embodiment of the disclosure. The cell 100 includes a first electrode layer 102, a first carrier-selective contact layer 104, a solar-cell absorber layer 106 (light-absorber layer 106), a second carrier-selective contact layer 108, and a second electrode layer 110.

The first electrode layer 102 is an electrically conductive layer that is substantially transparent to at least wavelengths of interest for a solar cell (e.g., from about 300 to about 1200 nanometers). In some embodiments, the first electrode layer 102 can include a layer of electrically conductive optically transparent material disposed over an optically transparent substrate. The electrically conductive optically transparent material has a thickness that ranges from about 10 nm to about 100 nm. The electrically conductive optically transparent material can be fluorine-doped tin oxide (FTO), indium doped tin oxide (ITO), titanium nitride (TiN), aluminum-doped zinc oxide (AZO), or any other suitable electrically conductive material that is substantially transparent to the wavelengths of interest. The optically transparent substrate can be glass or any other suitable optically transparent material which is substantially transparent to the wavelengths of interest including, without limitation, plastic, quartz, and fused silica.

The first carrier-selective contact layer 104 can be an electron-selective contact layer formed of titanium dioxide. The electron-selective contact layer 104 has a thickness ranging from about 10 nm to about 100 nm. In some other embodiments, the electron-selective contact layer 104 can be formed of zinc oxide (e.g., ZnO), tin oxide (e.g., $SnO_2$), aluminum oxide (e.g., $Al_2O_3$), doped-oxide (niobium-doped titanium oxide, etc.), or other wide-bandgap oxides.

The light-absorber layer 106 is an alloyed halide double perovskite material of the present disclosure. The light-absorber layer 106 has a thickness that ranges from about 100 nm to about 500 μm. The alloyed halide double perov-skite material comprises the formula $A_2B_{1-a}B'_{1-b}D_xX_6$, where A is an inorganic cation, an organic cation, a mixture of inorganic cations, a mixture of organic cations, or a mixture of one or more inorganic cations and one or more organic cations, where B is a metal, a mixture of metals, a metalloid, a mixture of metalloids, any mixture thereof, or is absent (a vacancy), where B' is a metal, a mixture of metals, a metalloid, a mixture of metalloids, any mixture thereof, or is absent, where D is a dopant, and where X is a halide or a mixture of halides and where x=a+b. More, specifically, component A of the double perovskite structure is an inorganic cation, such as but not limited to Li, Na, K, Rb, Cs, Ca, Sr, Ba, Ag, Tl, or any mixture thereof, an organic cation such as but not limited to $NH_4^+$, $(CH_3NH_3)_+$, $(CH(NH_2)_2^+)$, $(C(NH_2)_3^+)$, $CH_3CH_2NH_3$, $^+NH_3OH^+$, or any mixture thereof, or any mixture of one or more of the aforesaid inorganic cations and one or more of the aforesaid organic cations. Component B of the double perovskite structure is a metal, such as but not limited to, Li, Na, K, Rb, Cs, Cu, Ag, Au, Al, In, Tl, Ga, Bi, Se, Sn, Fe, Pb, Sc, Y, La, Ti, Zr, Hf, a lanthanide or any mixture thereof, a metalloid such as but not limited to As, Sb, Te, or any mixture thereof, or any mixture of one or more of the aforesaid metals and one or more of the aforesaid metalloids, or is absent. Component B' of the double perovskite structure is a metal, such as but not limited to, Li, Na, K, Rb, Cs, Cu, Ag, Au, Al, In, Tl, Ga, Bi, Se, Sn, Fe, Pb, Sc, Y, La, Ti, Zr, Hf, a lanthanide or any mixture thereof, a metalloid such as but not limited to As, Sb, Te, or any mixture thereof, or any mixture of one or more of the aforesaid metals and one or more of the aforesaid metalloids, or is absent. Component X of the double perovskite structure is a halide such as but not limited to F, Cl, Br, I, or any mixture thereof, a pseudohalide such as but not limit to CN, SCN—, OCN—, NCS—, SeCN—, $HCO_2$— or any mixture thereof, or a mixture of one or more of the aforesaid halides and one or more of the aforesaid pseudohalides. Component D, introduced into the double perovskite structure to alloy the structure, includes, but is not limited to Tl, In, Ga, Bi, Sb, As, Se, Te, Pb, Sn, Cu, Au, Zn, Cd, Hg, Sc, Y, Mn, Fe, K, Rb, Cs, Ca, Sr, Ba, La, Ti, Zr, Hf, Ag, Al, Ge, S, V, Nb, or any mixture thereof.

The second carrier-selective layer 108 can be a hole-selective contact layer formed of spiro-OMeTAD (2,2',7,7'-Tetrakis(N,N-di-p-methoxyphenylamine)-9,9'-spirobifluorene). The hole-selective contact layer 108 has a thickness that ranges from about 50 nm to about 200 nm. In some other embodiments, the hole-selective layer 108 can be formed of CuI (copper iodide), CuSCN (copper(i) thiocyanate), or the like.

In some other embodiments, the electron-selective contact layer 104 and the hole-selective contact layer 108 are reversed. In other words, the first carrier-selective layer 104 can be the hole-selective contact layer and the second carrier-selective layer 108 can be the electron-selective contact layer. In some further embodiments, the first and second carrier-selective contact layers 104 and 108 can be omitted.

The second electrode layer 110 can comprise gold or any other suitable electrically conductive material. The second electrode layer 110 has a thickness that ranges from about 50 nm to about 200 nm.

Figure 2:
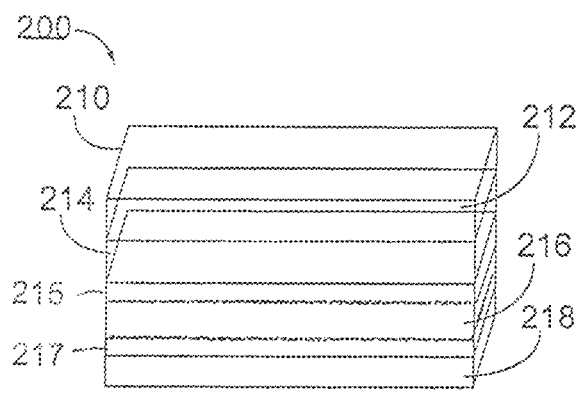
FIG. 2 is a schematic representation of a mechanically stacked tandem solid state solar cell device according to an embodiment of the present disclosure.
Figure 2:
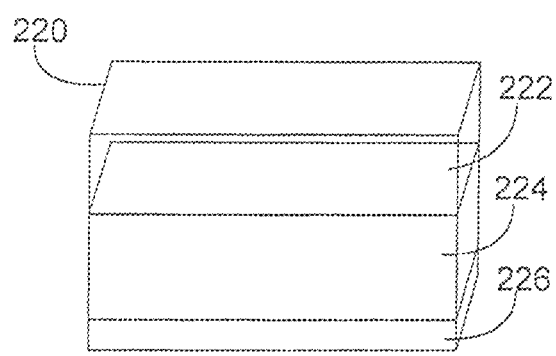

FIG. 2 schematically represents a multi junction mechanically stacked tandem solid state solar cell device 200 according to an embodiment of the disclosure. The device 200 is a two-junction device comprising a top solid state solar cell 210, which receives incident light energy impinging on the device 200 and a bottom solid state solar cell 220. The top solar cell 210 includes glass layer 212 (or other optically transparent layer such as plastic, quartz, and fused silica), a first electrically conductive optically transparent electrode layer 214 (e.g., FTO, ITO, TiN, AZO or any other suitable electrically conductive material that is substantially transparent to the wavelengths of interest), a first carrier-selective contact layer 215, which can be an electron-selective contact layer formed of titanium dioxide, or other suitable material including without limitation, ZnO, $SnO_2$, $Al_2O_3$, or a doped-oxide (niobium-doped titanium oxide, etc.), a (top) light-absorber layer 216, which comprises the alloyed halide double perovskite material of the present disclosure, a second carrier-selective layer 217, which can be a hole-selective contact layer formed of spiro-OMeTAD, or other suitable material including, without limitation, CuI or CuSCN, and a second electrically conductive optically transparent electrode layer 218 (e.g., FTO, ITO, TiN, AZO or any other suitable electrically conductive material that is substantially transparent to the wavelengths of interest).

In some other embodiments, the electron-selective contact layer 215 and the hole-selective contact layer 217 are reversed. In other words, the first carrier-selective layer 215 can be the hole-selective contact layer and the second carrier-selective layer 217 can be the electron-selective contact layer. In some further embodiments, the first and second carrier-selective contact layers 215 and 217 can be omitted.

The bottom solar cell 220 includes a Si or CIGS (bottom) light absorber layer 224, an emitter or electrically conductive optically transparent electrode layer 222, and a contact layer 226 (e.g., Au, Ag or any other suitable electrically conductively material). Layer 222 comprises an emitter layer if the solar-cell absorber layer 224 (light-absorber layer 224) comprises Si. If the light-absorber layer 224 comprises CIGS (copper indium gallium selenide), then layer 222 comprises the electrically conductive optically transparent electrode material (e.g., FTO, ITO, TiN, AZO or any other suitable electrically conductive material that is substantially transparent to the wavelengths of interest). The alloyed halide double perovskite solar-cell absorber layer 216 of the top solar cell 210 has a higher bandgap than the Si or CIGS bottom solar-cell absorber layer 224 of the bottom solar cell 220. Therefore, the two different solar cells 210, 220 increase the overall efficiency of the device 200 because the top solar cell 210 with the higher bandgap alloyed halide double perovskite light-absorber layer 220 converts high energy photons into electricity and the bottom solar cell 220 with the lower bandgap Si or CIGS light-absorber layer 224 converts the remaining low energy photons transmitted through the top solar cell 210 into electricity. Accordingly, a larger portion of the light energy is converted into electricity.

Figure 3:
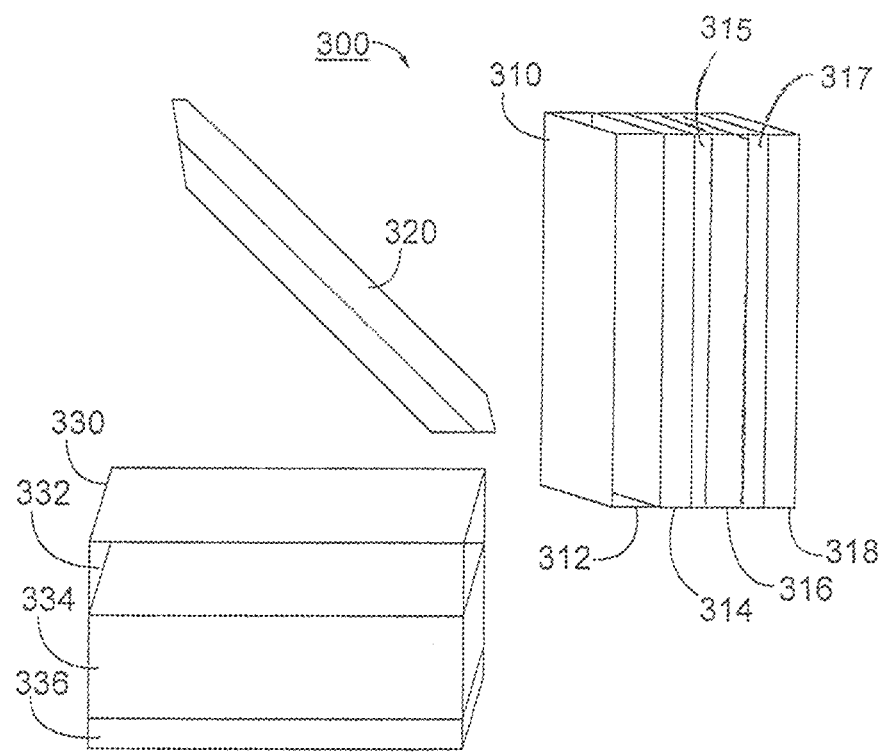
FIG. 3 is a schematic representation of a dichroic mirror tandem solid state solar cell device according to an embodiment of the present disclosure.

FIG. 3 schematically represents a multi junction dichroic tandem solid state solar cell device 300 according to an embodiment of the present disclosure. The device 300 comprises a first solid state solar cell 310, a second solid state solar cell 330, and a dichroic mirror 320, which divides the solar radiation spectrum between the solar cells 310, 330 so that a selected portion of the solar radiation spectrum is reflected toward the second solar cell 330 and the remaining portion of the solar radiation spectrum passes through the mirror 320 to the first solar cell 310. The first solar cell 310 includes a glass layer 312 (or other optically transparent layer such as plastic, quartz, and fused silica), an electrically conductive optically transparent electrode layer 314 (e.g., FTO, ITO, AZO or any other suitable electrically conductive material that is substantially transparent to the wavelengths of interest), a first carrier-selective contact layer 315, which can be an electron-selective contact layer formed of titanium dioxide, or other suitable material including without limitation, zinc oxide (e.g., ZnO), tin oxide (e.g., $SnO_2$), aluminum oxide (e.g., $Al_2O_3$), doped-oxide (niobium-doped titanium oxide, etc.), a (first) light-absorber layer 316 comprising the alloyed halide double perovskite material of the present disclosure, a second carrier-selective layer 317, which can be a hole-selective contact layer formed of spiro-OMeTAD (2,2',7,7'-Tetrakis (N,N-di-p-methoxyphenylamine)-9,9'-spirobifluorene), or other suitable material including, without limitation, CuI (copper iodide) or CuSCN (copper(i) thiocyanate), and a contact layer 318 (e.g., Au, Ag or any other suitable electrically conductive material).

In some other embodiments, the electron-selective contact layer 315 and the hole-selective contact layer 317 are reversed. In other words, the first carrier-selective layer 315 can be the hole-selective contact layer and the second carrier-selective layer 317 can be the electron-selective contact layer. In some further embodiments, the first and second carrier-selective contact layers 315 and 317 can be omitted.

The second solar cell 330 includes a Si or CIGS (second) light-absorber layer 334, an emitter or electrically conductive optically transparent electrode layer 332, and a contact layer 336 (e.g., Au, Ag or any other suitable electrically conductively material). Layer 332 comprises an emitter layer if the second light-absorber layer 334 comprises Si. If the second light-absorber layer 334 comprises CIGS (copper indium gallium selenide), then layer 332 comprises the electrically conductive optically transparent electrode layer (e.g., FTO, ITO, TiN, AZO or any other suitable electrically conductive material that is substantially transparent to the wavelengths of interest). As with the device of FIG. 2, the two different solar cells 310, 330 increase the overall efficiency of the device 300 because the first solar cell 310 with the higher bandgap alloyed halide double perovskite light-absorber layer 316 converts the high energy photons into electricity and the second solar cell 330 with the lower bandgap Si or CIGS light-absorber layer 334, converts the remaining low energy photons transmitted through the top solar 310 into electricity.

Figure 4:
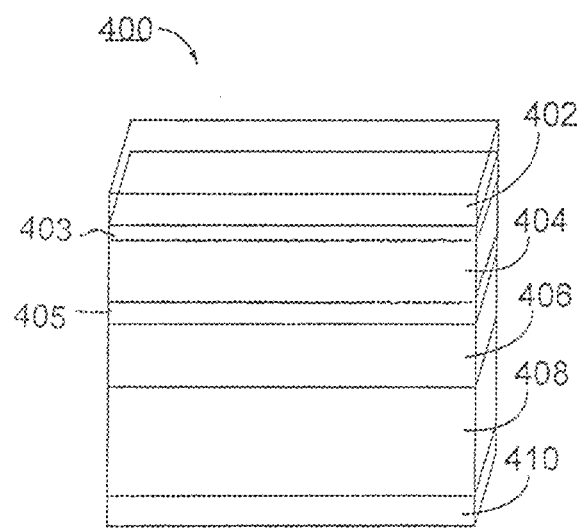
FIG. 4 is a schematic representation of a monolithically integrated tandem solid state solar cell device according to an embodiment of the present disclosure.

FIG. 4 schematically represents a multi junction monolithically integrated tandem solid state solar device 400 according to an embodiment of the disclosure. The device 400 includes a top light-absorber layer 404, which receives incident light energy impinging on the device 400, and a bottom light-absorber layer 408 connected in series with the top light-absorber layer 404. The top light-absorber 404 is disposed between first and second carrier-selective contact layers 403 and 405, respectively. The first carrier-selective contact layer 403 can be an electron-selective contact layer formed of titanium dioxide, or other suitable material including without limitation, zinc oxide (e.g., ZnO), tin oxide (e.g., $SnO_2$), aluminum oxide (e.g., $Al_2O_3$), doped-oxide (niobium-doped titanium oxide, etc.). The second carrier-selective layer 405 can be a hole-selective contact layer formed of spiro-OMeTAD (2,2',7,7'-Tetrakis(N,N-di-p-methoxyphenylamine)-9,9'-spirobifluorene), or other suitable material including, without limitation, CuI (copper iodide) or CuSCN (copper(i) thiocyanate). A transparent electrode layer 402 (e.g., FTO, ITO, TiN, AZO or any other suitable electrically conductive material that is substantially transparent to the wavelengths of interest) is disposed over the first carrier-selective contact layer 403 and the top solar-cell absorber layer 404. A contact layer 410 (e.g., Au, Ag or any other suitable electrically conductively material) is disposed over the bottom light-absorber layer 408. The top light-absorber layer 404 comprises the alloyed halide double perovskite material of the present disclosure and the bottom light-absorber layer 408 comprises Si or CIGS. A tunnel junction/recombination layer 406 connects the top light-absorber layer 404 with the bottom light-absorber layer 408 in series. As with the devices of FIGS. 2 and 3, the two different light-absorber layers 404, 408 increase the overall efficiency of the device 400 because the top light-absorber layer 404 with the higher bandgap converts the high energy photons into electricity and the bottom Si or CIGS light-absorber layer 408 with the lower bandgap, converts the remaining low energy photons transmitted through the top light-absorber layer 404 into electricity.

In some other embodiments, the electron-selective contact layer 403 and the hole-selective contact layer 405 are reversed. In other words, the first carrier-selective layer 403 can be the hole-selective contact layer and the second carrier-selective layer 405 can be the electron-selective contact layer. In some further embodiments, the first and second carrier-selective contact layers 403 and 405 can be omitted.

It should be understood that the tandem solar devices of the present disclosure can include more than two solar cells each having one or more junctions. In such embodiments, one or more of the solar cells can include a light absorber layer comprising the alloyed halide double perovskite material of the present disclosure.

The solar cells of the present disclosure can be fabricated using well known semiconductor and microelectronic fabrication methods including sequential solution- or vapor-deposition and evaporation. For example, see U.S. Pat. No. 9,564,593 which is incorporated herein by reference.

The alloyed halide double perovskite material of the present disclosure is made by dilute impurity alloying $Cs_2AgBiBr_6$. As will be discussed in detail further on, the alloyed halide double perovskite material of the present disclosure exhibits photophysical properties which are competitive with those of the lead perovskites (e.g., $(MA)PbI_3$).

Figure 9A:
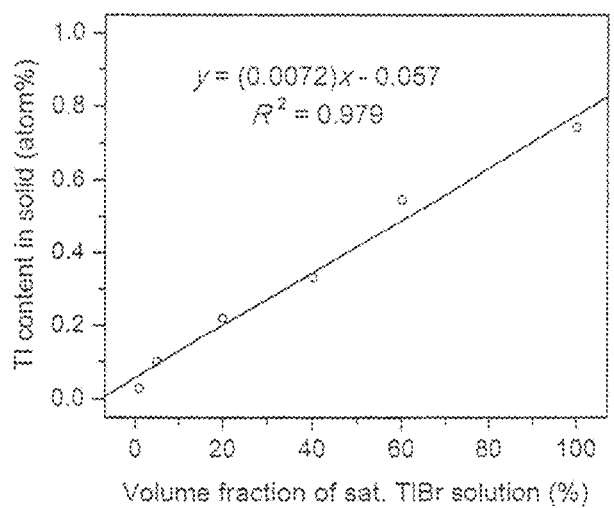
FIG. 9A is a graph showing the comparison of the Tl concentration in $Cs_2(Ag_{1-a}Bi_{1-b})Tl_xBr_6$ as determined by inductively coupled plasma (ICP) techniques with the volume fraction of the saturated TlBr solution in the reaction mixture. The relationship is linear showing that the amount of Tl impurities in $Cs_2(Ag_{1-a}Bi_{1-b})Tl_xBr_6$ can be controlled by the Tl concentration in solution.

The $A_2BB'X_6$ double perovskites offer far greater diversity of B-site metals compared to $ABX_3$ perovskites. While there has been much recent interest in halide double perovskites as solar-cell absorbers, these materials have so far displayed high bandgaps of 1.95-3.02 eV. Lead's filled 6s orbitals at the valence-band maximum (VBM) and empty 6p orbitals at the conduction-band minimum (CBM) play an important role in $APbI_3$'s strong direct-gap absorption (FIG. 6A). The double perovskite $(MA)_2TlBiBr_6$, where Lead ($Pb^{2+}$) is replaced by isoelectronic Thallium ($Tl^+$) and Bismuth ($Bi^{3+}$), has a similar orbital composition at its band edges (FIG. 6B). While both $(MA)PbI_3$ and $(MA)_2TlBiBr_6$ have direct transitions, inclusion of Ag s (Ag d) orbitals in $Cs_2AgBiBr_6$ shifts the CBM (VBM) leading to an indirect gap. We hypothesized that increasing $6s^2$ and $6p^0$ orbital character near $Cs_2AgBiBr_6$'s band edges may allow us to recover the direct gap of $APbI_3$. Therefore, $Tl^+$ was incorporated as a dilute impurity into $Cs_2AgBiBr_6$ to form the alloyed halide double perovskite material of the present disclosure Solid $Cs_2AgBiBr_6$ crystallizes from solution as translucent orange truncated octahedra. In contrast, adding TlBr to the crystallization solution affords opaque black octahedral crystals of the Tl-alloyed halide double perovskite having the homologous series formulation: $Cs_2(Ag_{1-a}Bi_{1-b})Tl_xBr_6$ (FIG. 5B). Using this method, the Tl content can be tuned across the series $Cs_2(Ag_{1-a}Bi_{1-b})Tl_xBr_6$ (0.003<x=a+b<0.075) resulting in 0.03-0.75 atom % Tl (see FIGS. 9A and 9B and Table 1 below).

TABLE 1

Elemental analysis of $Cs_2(Ag_{1-a}Bi_{1-b})Tl_xBr_6$ samples.

| Sample # | Atom % by ICP[a] | | | | Fraction of the saturated TlBr solution (volume %) | Tl content $(x)^b$ | Tl concentration $(cm^{-3})$ |
|---|---|---|---|---|---|---|---|
| | Bi | Cs | Ag | Tl | | | |
| 1 | 10.0 | 19.7 | 10.6 | 0.744 | 100 | 0.0744 | $2.09 \times 10^{20}$ |
| 2 | 10.3 | 19.8 | 10.8 | 0.547 | 60 | 0.0547 | $1.49 \times 10^{20}$ |
| 3 | 10.5 | 19.9 | 10.9 | 0.33 | 40 | 0.033 | $8.8 \times 10^{19}$ |
| 4 | 10.2 | 20.0 | 10.6 | 0.22 | 20 | 0.022 | $6.0 \times 10^{19}$ |
| 5 | 10.5 | 19.5 | 10.6 | 0.099 | 5 | 0.0099 | $2.7 \times 10^{19}$ |
| 6 | 10.7 | 19.8 | 10.9 | 0.029 | 1 | 0.0029 | $7.6 \times 10^{18}$ |

[a] ICP = Inductively coupled plasma analysis. Bromide and metal content could not be simultaneously determined. The missing mass in each sample is assumed to be due entirely to bromide.
[b] x in $Cs_2(Ag_{1-a}Bi_{1-b})Tl_xBr_6$. Experimental uncertainty corresponds to the last digit reported.

Therefore, variations in Tl concentration are statistically significant while variations in Bi, Cs, and Ag concentration are not.

Single-crystal X-ray diffraction (SC-XRD) showed $Cs_2(Ag_{1-a}Bi_{1-b})Tl_xBr_6$'s structure to be nearly identical to that of $Cs_2AgBiBr_6$ (see Table 2 below).

TABLE 2

Crystallographic information.

| Compound | $Cs_2AgBiBr_6$[a] | $Cs_2(Ag_{1-a}Bi_{1-b})Tl_xBr_6$ (x = 0.075) | $(MA)_2TlBiBr_6$ | $(MA)_2Tl_{1-x}Ag_xBiBr_6$ (x = 0.2) |
|---|---|---|---|---|
| Formula weight, g · mol$^{-1}$ | 1062.07 | 1069.31 | 956.94 | 937.61 |
| Temperature, K. | 300 | 298 | 296 | 298 |
| Crystal system | Cubic | Cubic | Cubic | Cubic |
| Space group | Fm-3m | Fm-3m | Fm-3m | Fm-3m |
| a, b, c, Å | 11.2499 (4) | 11.2322 (5) | 11.9173 (10) | 11.8941 (5) |
| α, β, γ, ° | 90 | 90 | 90 | 90 |
| Volume, Å$^3$ | 1423.79 (9) | 1417.08 (19) | 1692.5 (4) | 1682.7 (2) |
| Z | 4 | 4 | 4 | 4 |
| Density (calculated), g · cm$^{-3}$ | 4.955 | 5.012 | 3.755 | 3.702 |
| Absorption coefficient, mm$^{-1}$ | 32.683 | 32.837 | 34.023 | 29.852 |
| F(000) | 1800 | 1800 | 1600 | 1571 |
| Crystal dimensions, mm | 0.15 × 0.10 × 0.05 | 0.06 × 0.06 × 0.06 | 0.05 × 0.05 × 0.05 | 0.05 × 0.05 × 0.05 |
| Radiation | synchrotron (λ = 0.68880 Å) | synchrotron (λ = 0.68880 Å) | MoKα (λ = 0.71073 Å) | synchrotron (λ = 0.68880 Å) |
| 2θ range, ° | 6.078 to 54.54 | 6.088 to 50.842 | 5.922 to 50.416 | 5.75 to 50.746 |
| Index ranges | −14 ≤ h ≤ 14<br>−14 ≤ k ≤ 14<br>−14 ≤ l ≤ 14 | −14 ≤ h ≤ 14<br>−14 ≤ k ≤ 14<br>−14 ≤ l ≤ 14 | −14 ≤ h ≤ 14<br>−13 ≤ k ≤ 14<br>−14 ≤ l ≤ 12 | −14 ≤ h ≤ 14<br>−14 ≤ k ≤ 14<br>−14 ≤ l ≤ 14 |
| Reflections collected/unique | 6134/122 | 5206/103 | 3789/110 | 6706/121 |
| Completeness to θ$_{max}$, % | 100 | 100 | 100 | 100 |
| Max. and min. transmission | 0.292, 0.086 | 0.4289, 0.3181 | 0.4287, 0.2886 | 0.4289, 0.3395 |
| Data/restraints/parameters | 122/0/8 | 103/0/8 | 110/4/9 | 121/2/10 |
| Goodness-of-fit on F$^2$ | 1.199 | 1.507 | 1.220 | 1.200 |
| Final R indices [I > 2σ(I)][b] | $R_1$ = 0.0108<br>$wR_2$ = 0.0230 | $R_1$ = 0.0109<br>$wR_2$ = 0.0224 | $R_1$ = 0.0383<br>$wR_2$ = 0.0930 | $R_1$ = 0.0299<br>$wR_2$ = 0.0728 |
| R indices (all data)[b] | $R_1$ = 0.0108<br>$wR_2$ = 0.0230 | $R_1$ = 0.0109<br>$wR_2$ = 0.0224 | $R_1$ = 0.0429<br>$wR_2$ = 0.0969 | $R_1$ = 0.0310<br>$wR_2$ = 0.0736 |
| Largest diff. peak and hole, e · Å$^{-3}$ | 0.264, −0.395 | 0.41, −0.47 | 1.33, −2.06 | 1.34, −0.82 |

Figures 7A, 7B, 7C:
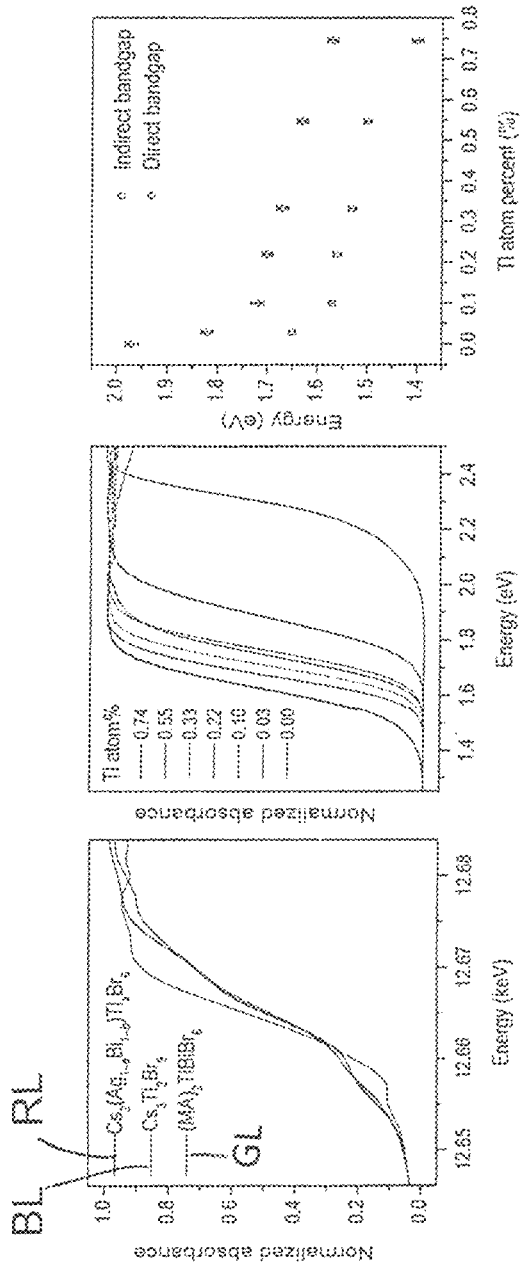
FIG. 7A is a graph showing the X-ray near edge absorption structure (XANES) spectrum of $Cs_2(Ag_{1-a}Bi_{1-b})Tl_xBr_6$ for x=0.075 (RL) and spectra of $Tl^+$ (GL) and $Tl^{3+}$ standards (BL).
FIG. 7B is a graph showing the absorbance spectra of $Cs_2(Ag_{1-a}Bi_{1-b})Tl_xBr_6$.
FIG. 7C is a graph of the variation of the apparent bandgaps of $Cs_2(Ag_{1-a}Bi_{1-b})Tl_xBr_6$ extracted by linear fits to a $\alpha^2$ vs. E (direct gap) and a $\alpha^{1/2}$ vs. E plots (indirect gap). Error bars represent the mean standard error.
Figure 9B:
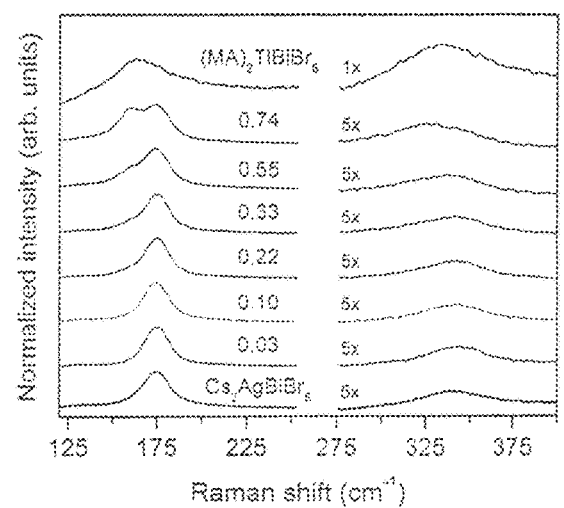
FIG. 9B is a graph showing the evolution of the double perovskites' Raman spectra upon Tl incorporation (bottom to top): increasing Tl levels result in a shoulder at 160 cm$^{-1}$ forming near the peak at 175 cm$^{-1}$ and a gradual redshift of the higher energy peak from 340 cm$^{-1}$ to 326 cm$^{-1}$. The numbers 0.03, 0.10, 0.22, 0.33, 0.55, and 0.74 refer to the atom percent of Tl in $Cs_2(Ag_{1-a}Bi_{1-b})Tl_xBr_6$.
Figure 10A:
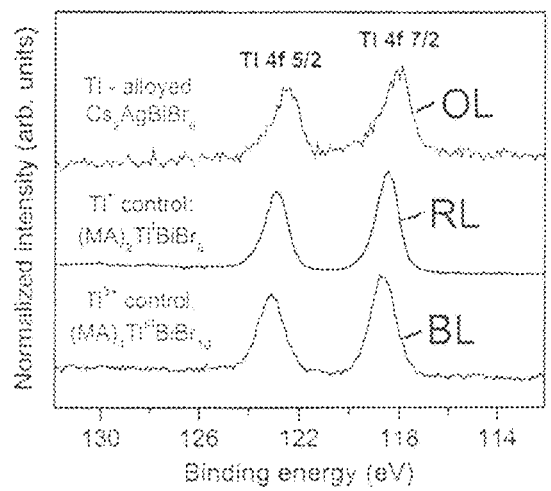
FIG. 10A is a graph showing high-resolution XPS spectra of the Tl-4f signal in a single crystal of $Cs_2(Ag_{1-a}Bi_{1-b})Tl_xBr_6$ with x=a+b=0.075 (OL) and in $Tl^+$ (RL) and $Tl^{3+}$ (BL) control compounds. The very small energy difference between signals from $Tl^+$ and $Tl^{3+}$ controls does not allow us to determine the oxidation state of Tl in $Cs_2(Ag_{1-a}Bi_{1-b})Tl_xBr_6$ by XPS.
Figure 10B:
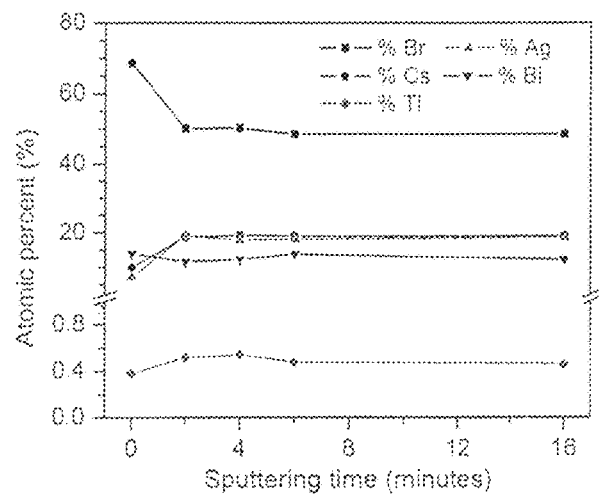
FIG. 10B is a graph showing the elemental composition of a single crystal of $Cs_2(Ag_{1-a}Bi_{1-b})Tl_xBr_6$ as a function of sputtering depth, obtained from high-resolution scans of Tl-4f, Bi-5d, Ag-3d, Cs-3d, and Br-3d signals, showing uniform distribution in the crystal bulk For elemental analysis, ICP is more accurate than XPS (see Table 1).

[a] Taken from Ref. 1.
[b] $R_1 = \Sigma ||F_o| - |F_c||/\Sigma |F_o|$; $wR_2 = [\Sigma w(F_o^2 - F_c^2)^2/\Sigma (F_o^2)^2]^{1/2}$ X-ray photoelectron spectroscopy (XPS) on $Cs_2(Ag_{1-a}B_{1-b})Tl_xBr_6$ crystals revealed diagnostic Tl 4f signals (FIG. 10A) and sputtering experiments confirmed that the Tl is uniformly distributed (FIG. 10B). Thallium incorporation also redshifts the broad band at 340 cm$^{-1}$ in $Cs_2AgBiBr_6$'s Raman spectrum to 326 cm$^{-1}$, while a new band appears at 160 cm$^{-1}$ (FIG. 9B). Notably, $(MA)_2TlBiBr_6$'s spectrum has a similar band at 163 cm$^{-1}$. To determine the Tl oxidation state, we measured the X-ray absorption near-edge structure (XANES) of $Cs_2(Ag_{1-a}B_{1-b})Tl_xBr_6$ (x=0.075) at the Tl-L3 edge (FIG. 7A). While $Tl^{3+}$ compounds display a distinctive XANES spectrum with three inflection points on the rising edge, $Tl^+$ compounds display only one. Interestingly, the XANES spectrum of $Cs_2(Ag_{1-a}B_{1-b})Tl_xBr_6$ matches that for a $Tl^{3+}$ compound with no indication of $Tl^+$.

To explore this further, we calculated the energy gain/loss due to Tl substitution, $\Delta E = E^{doped} - E^{undoped}$, at both $Ag^+$ and $Bi^{3+}$ sites using density functional theory (DFT) within the generalized gradient approximation of Perdew, Burke, and Ernzerhof (PBE) as implemented in the Vienna Ab initio Simulation Package (VASP) code. We treat spin-orbit coupling (SOC) effects self-consistently, as described further on in greater detail. For $Cs_2(Ag_{1-a}Bi_{1-b})Tl_xBr_6$ x=0.25, substitution of $Tl^{3+}$ for $Bi^{3+}$ is thermodynamically uphill ($\Delta E$=0.7 eV). In contrast, substitution of $Tl^+$ for $Ag^+$ is energetically favorable ($\Delta E$=−0.05 eV). For $Cs_2(Ag_{1-a}Bi_{1-b})Tl_xBr_6$ x=0.06 however, the energy difference between Tl substitution for $Bi^{3+}$ and $Ag^+$ decreases significantly with $\Delta E(Bi^{3+})$= 0.1 eV and $\Delta E(Ag^+)$=−0.01 eV.

Figure 10C:
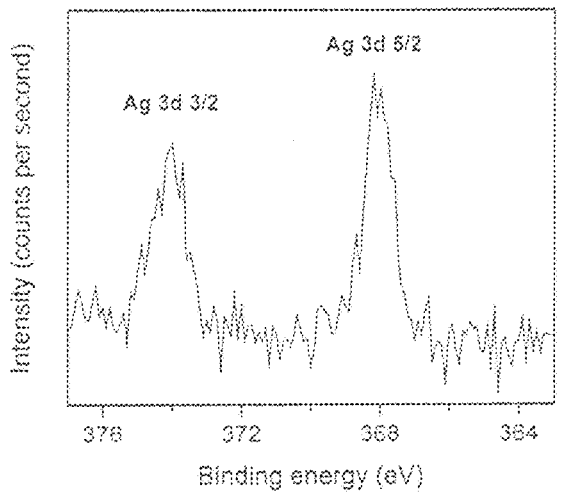
FIG. 10C is a graph showing high-resolution XPS spectrum of the Ag-3d signals in a sputtered $(MA)_2(Tl_{1-a}Bi_{1-b})Ag_xBr_6$ single crystal confirming the presence of Ag in the material.
Figure 11:
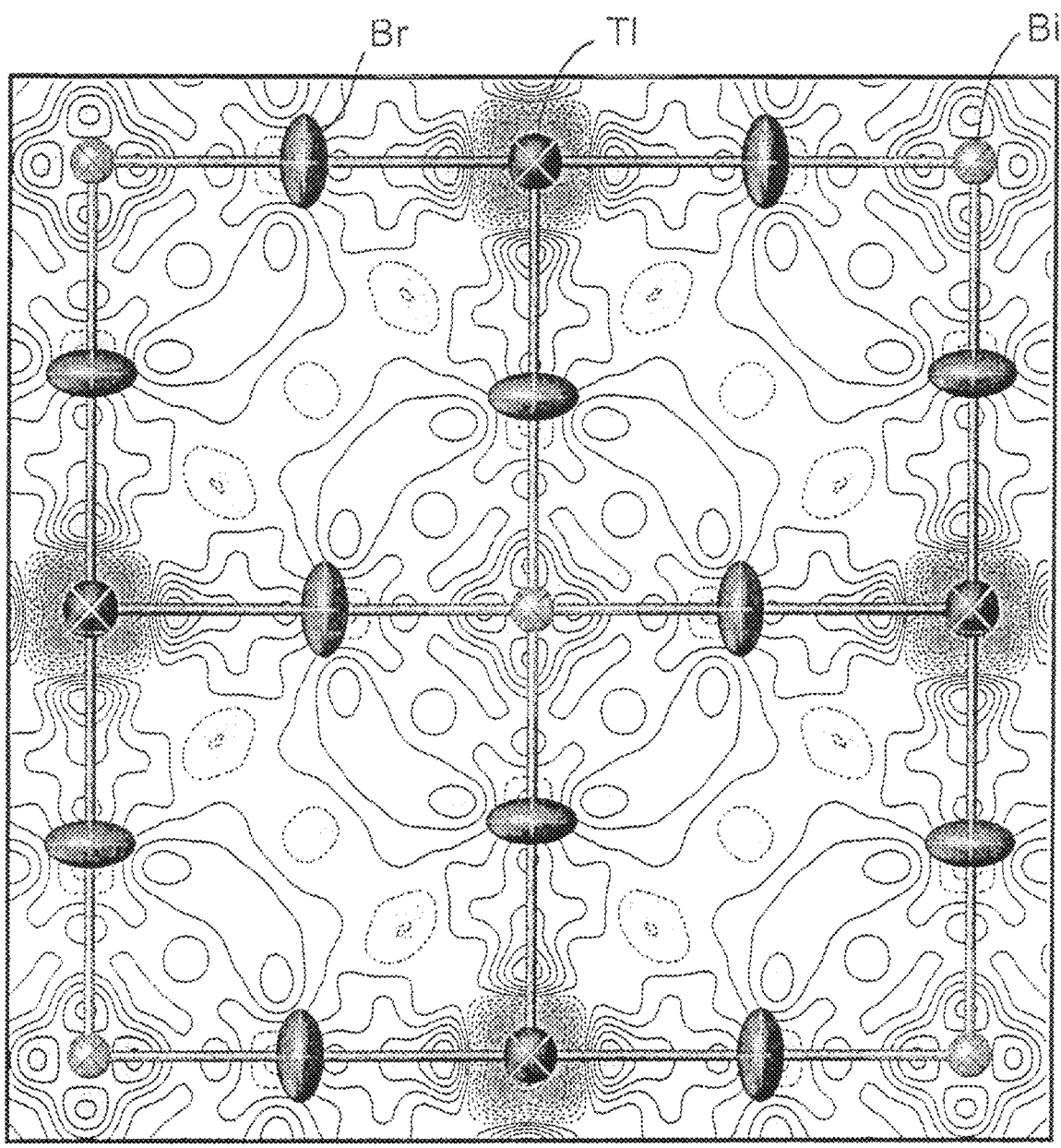
FIG. 11 is a projection of the (a,b) plane showing the differences between the calculated and observed structure factors for a crystal of $(MA)_2(Tl_{1-a}Bi_{1-b})Ag_xBr_6$ modeled with full Tl occupancy. Excess electron density in the model is shown in blue, while missing electron density is shown in red. Atoms of Br, Tl, and Bi are represented by the red, black, and orange ellipsoids, respectively. The large electron density hole at the Tl site is indicative of partial occupancy of Ag atoms at that site.
Figure 12A:
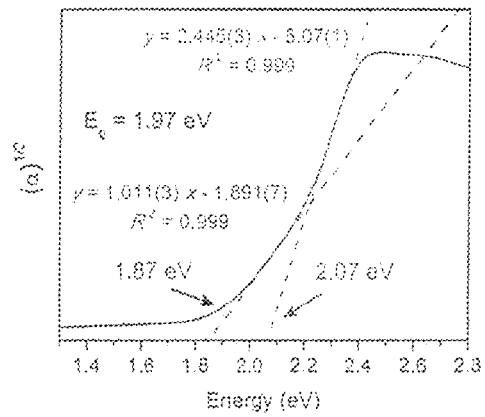
FIG. 12A is plot of $\alpha^{1/2}$ vs. E for $Cs_2AgBiBr_6$ showing the characteristic two linear regions indicative of an indirect bandgap.
Figures 12B, 12C:
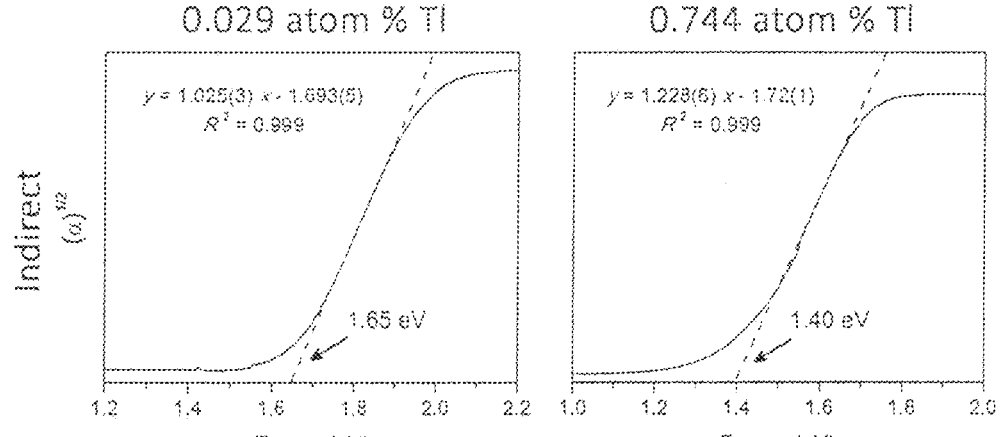
FIGS. 12B and 12C are plots of $\alpha^{1/2}$ vs. E for $Cs_2(Ag_{1-a}Bi_{1-b})Tl_xBr_6$ (x=a+b=0.003-0.075) samples with the least (0.029 atom %) and most (0.744 atom %) Tl.
Figures 12D, 12E:
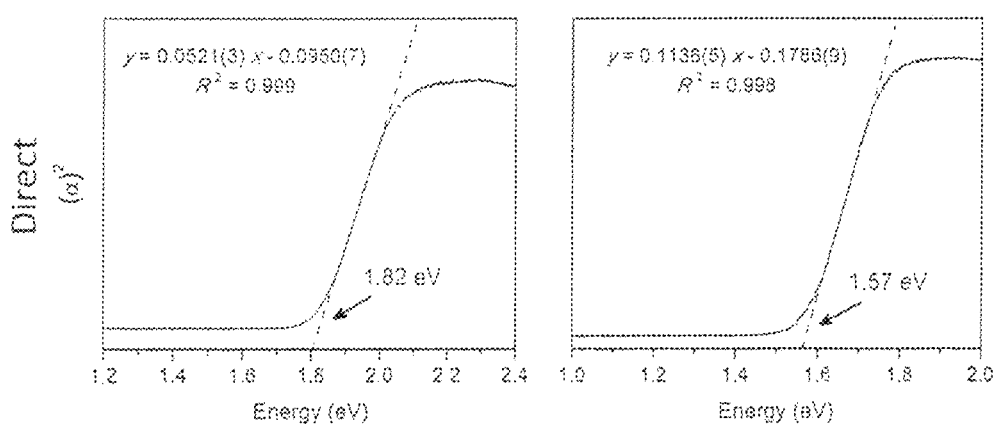
FIGS. 12D and 12E are plots of $\alpha^2$ vs. E for $Cs_2(Ag_{1-a}Bi_{1-b})Tl_xBr_6$ (x=a+b=0.003-0.075) samples with the least (0.029 atom %) and most (0.744 atom %) Tl.

Noting that $Tl^{3+}$ substitution for $Bi^{3+}$ is less favored at higher x, we examined whether $Tl^+/Ag^+$ substitution occurs in the concentrated Tl regime by alloying Ag into the Tl—Bi perovskite: $(MA)_2TlBiBr_6$. Synthesizing $(MA)_2TlBiBr_6$ in the presence of $Ag^+$ affords $(MA)_2(Tl_{1-a}Bi_{1-b})Ag_xBr_6$. Refining SC-XRD data for $(MA)_2(Tl_{1-a}Bi_{1-b})Ag_xBr_6$ with full Tl occupancy shows substantial missing electron density at the Tl site (FIG. 11). We modeled partial Ag substitution at the Tl site using 4 datasets collected at different X-ray wavelengths. From this analysis, we found ca. 20% Ag occupancy at the Tl site and a large improvement in refinement statistics, as described further on in greater detail, supporting the formula $(MA)_2(Tl_{0.8}Ag_{0.2})BiBr_6$. The presence of Ag in $(MA)_2(Tl_{1-a}Bi_{1-b})Ag_xBr_6$ was further confirmed using XPS (FIG. 10C), corroborating a Ag/Tl mixed site in $(MA)_2(Tl_{1-a}Bi_{1-b})Ag_xBr_6$. Our combined XANES, DFT, and SC-XRD results suggest that Tl can substitute at either Ag or Bi sites, and in the dilute alloying regime of $Cs_2(Ag_{1-a}Bi_{1-b})Tl_xBr_6$ substitution for Bi is dominant. The larger lattice in $(MA)_2TlBiBr_6$ may also more easily accommodate the larger $Tl^+$, while the smaller lattice in $Cs_2AgBiBr_6$ is better suited for $Tl^{3+}$ substitution. To examine the optical effects of Tl alloying, reflectance spectra of $Cs_2AgBiBr_6$ and $Cs_2(Ag_{1-a}Bi_{1-b})Tl_xBr_6$ were converted to pseudo-absorbance spectra using the Kubelka-Munk transformation (FIG. 7B) and bandgaps were extrapolated from $\alpha^r$ vs. photon energy (E) plots (r=0.5 and 2 for indirect and direct gaps, respectively; $\alpha$=pseudo-absorption coefficient; FIGS. 8A-8E). For $Cs_2AgBiBr_6$, these data corroborate the indirect bandgap previously reported. For $Cs_2(Ag_{1-a}Bi_{1-b})Tl_xBr_6$ (x=0.075), the data support either a direct gap of 1.6 eV or an indirect gap of 1.4 eV, as described further on in greater detail.

The bandgap energy drops sharply from 1.95 eV in $Cs_2AgBiBr_6$ (indirect) to 1.72 eV (direct) or 1.57 (indirect) in $Cs_2(Ag_{1-a}Bi_{1-b})Tl_xBr_6$: x=0.010. At x>0.010 (0.10 atom % Tl) the gap is less sensitive to Tl content and decreases more slowly. The gap reaches 1.40 eV (indirect) or 1.57 eV (direct) at the highest alloying level of x=0.075. Interestingly, the bandgaps that arise from Tl alloying are much lower than those observed for undoped $Cs_2AgBiBr_6$ (1.95 eV) or for the fully Tl-substituted $(MA)_2TlBiBr_6$ (2.16 eV). Notably, dilute Tl alloying brings $Cs_2AgBiBr_6$'s bandgap within the ideal range for a single-junction photovoltaic absorber.

Figure 13A:
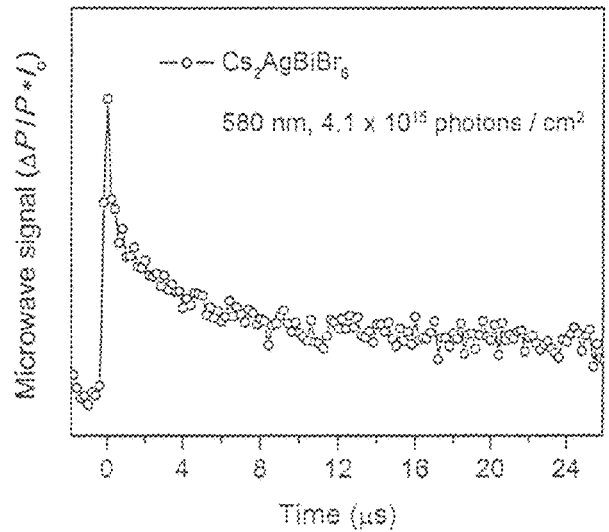
FIG. 13A is a graph showing the time-resolved microwave conductivity (TRMC) decay trace of a millimeter-size single crystal of $Cs_2AgBiBr_6$ pumped with a 580 nm laser pulse.
Figure 13B:
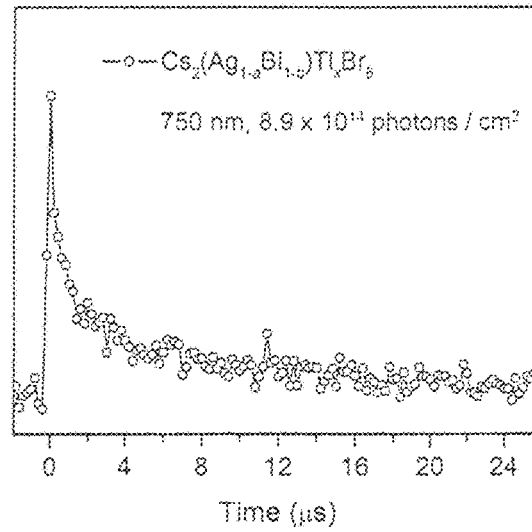
FIG. 13B is a graph showing the TRMC decay trace of a millimeter-size single crystal of $Cs_2(Ag_{1-a}Bi_{1-b})Tl_xBr_6$ (with x=0.075) pumped with a 750 nm laser pulse. Microwave signal refers to the normalized change in microwave power ($\Delta P/P$) corrected for the incident pump intensity ($I_0$).
Figures 15A, 15B, 15C:
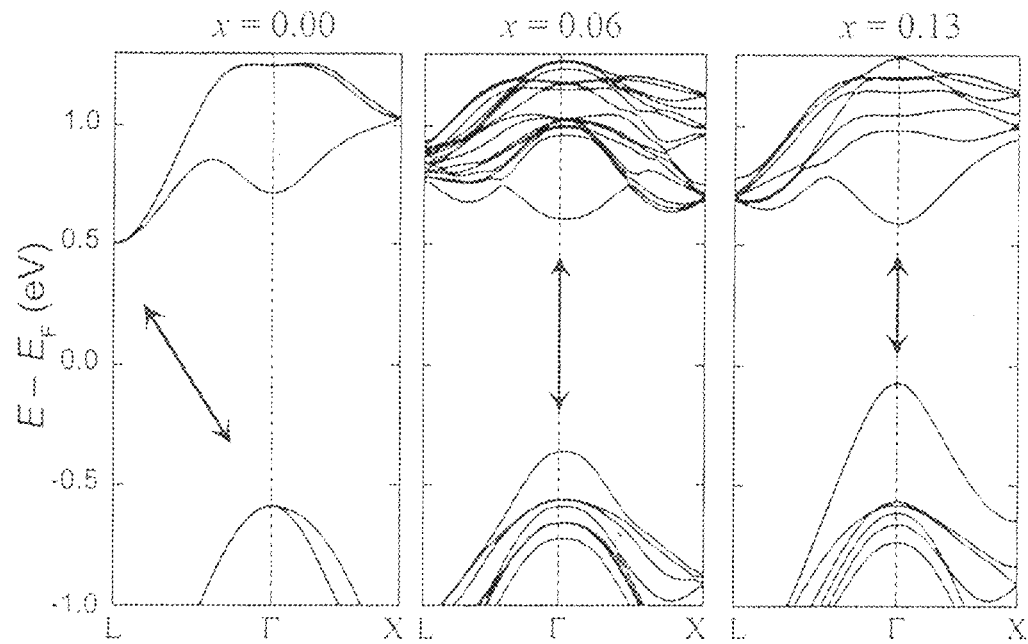
FIGS. 15A-15C show band structures for $Cs_2AgBiBr_6$ and $Cs_2(Ag_{1-a}Bi_{1-b})Tl_xBr_6$ with x=0.00 (FIG. 15A), with x=0.06 (FIG. 15B), and with x=0.13 (FIG. 15C). The energy levels are shifted to align the lowest-energy valence bands, which have Cs s character.

Dopants can form recombination trap states that decrease carrier lifetime. We therefore performed time-resolved microwave photoconductivity (TRMC) measurements, which directly probe free-carrier lifetime. Although we observe a decrease in carrier lifetime upon moving from $Cs_2AgBiBr_6$ to $Cs_2(Ag_{1-a}Bi_{1-b})Tl_xBr_6$ crystals, the lifetimes in $Cs_2(Ag_{1-a}Bi_{1-b})Tl_xBr_6$ remain long, in the μs regime (FIGS. 13A and 13B), suggesting that carriers can be efficiently extracted in a solar cell. A similar measurement on $(MA)PbI_3$ crystals revealed a carrier lifetime of up to 15 μs. A detailed analysis of our TRMC measurements will be reported separately. Our results show that $Cs_2(Ag_{1-a}Bi_{1-b})Tl_xBr_6$ is competitive with $(MA)PbI_3$ with respect to two key indicators for an efficient absorber: bandgap energy and carrier lifetime.

Figure 8A:
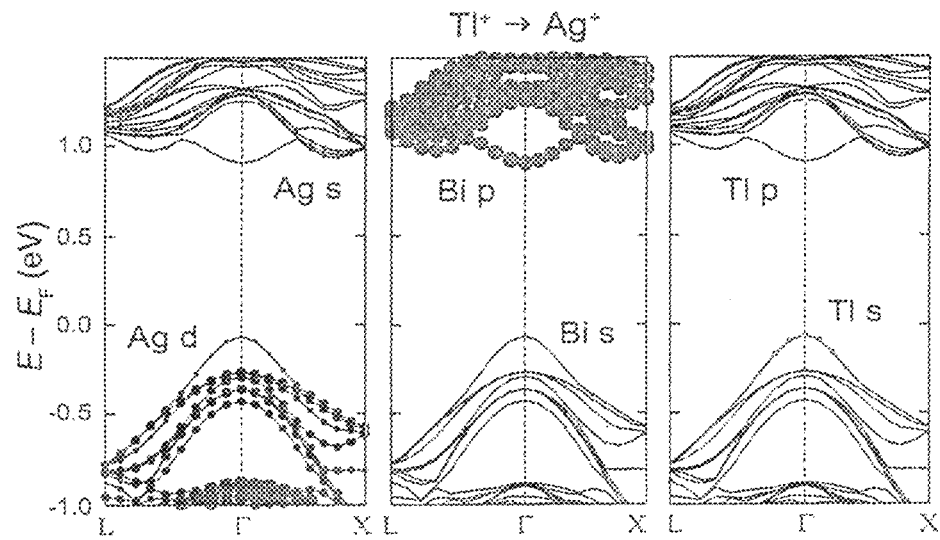
FIGS. 8A and 8B show band structures of $Cs_2(Ag_{1-a}Bi_{1-b})Tl_xBr_6$ (x=0.06) for substitution of $Tl^+$ for $Ag^+$ (FIG. 8A) and substitution of $Tl^{3+}$ for $Bi^{3+}$ (FIG. 8B). The metal orbital characters of the bands are shown with dotted lines.
Figure 8B:
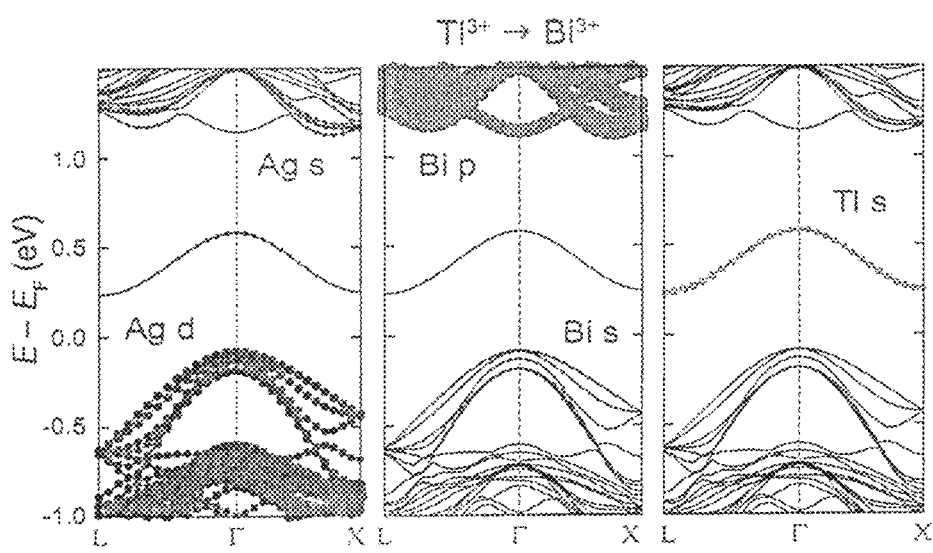
Figures 16A, 16B, 16C:
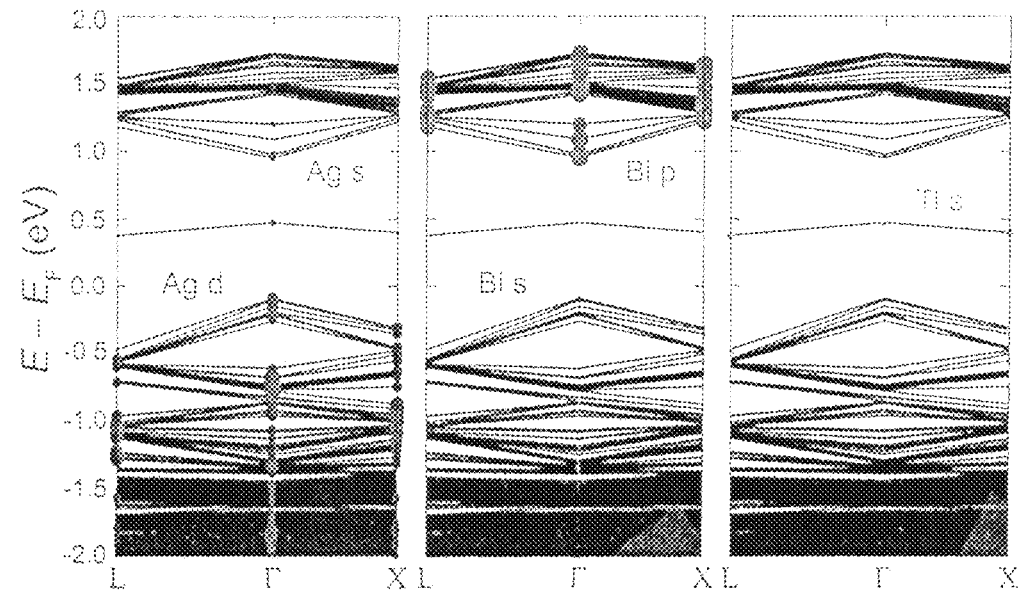
FIGS. 16A-16C show band structures for $Cs_2(Ag_{1-a}Bi_{1-b})Tl_xBr_6$ with x=0.06 and equal substitution of $Tl^+$ and $Tl^{3+}$ at Ag and Bi sites where

We performed DFT calculations to determine the evolution of $Cs_2(Ag_{1-a}Bi_{1-b})Tl_xBr_6$'s electronic structure with Tl alloying, considering both $Ag^+$ and $Bi^{3+}$ substitution. FIG. 6C shows $Cs_2AgBiBr_6$'s band structure calculated with DFT-PBE+SOC, as described further on in greater detail, with the conduction bands rigidly shifted to reproduce the experimental bandgap. The CBM of $Cs_2AgBiBr_6$ has Bi p character at Γ and Bi p-Ag s character at L because completely symmetric Ag s-Bi p hybridization is forbidden at Γ, but allowed at L. The calculated indirect (direct) bandgap is 1.09 eV (1.30 eV) underestimating experiment by ~0.9 eV, as expected from DFT-PBE and similar to the trends reported for $(MA)PbI_3$. To obtain quantitative optical gaps and spectra, a more advanced treatment of exchange and correlation effects, including electron-hole interactions, is required, such as in ab initio many-body perturbation theory (MBPT). However, we expect that computed trends in bandgaps and relative energy differences between direct and indirect gaps will be captured reliably by DFT-PBE+SOC, at significantly less computational expense for these complex systems. To study the effects of Tl substitution, we constructed $Cs_2(Ag_{1-a}Bi_{1-b})Tl_xBr_6$ unit cells with 80, 160, and 320 atoms, where in each case substitution of one B-site atom with Tl corresponds to x=0.13, x=0.06, and x=0.03, respectively. Keeping the lattice parameters fixed to those from experiment, we optimize all internal coordinates without symmetry constraints using DFT-PBE, and subsequently calculate the band structure along high-symmetry directions including spin-orbit interactions self-consistently. At x=0.06, $Tl^+$ substitution for $Ag^+$ results in a direct gap at Γ and a bandgap reduction of ca. 0.1 eV (FIG. 8A). Substitution of $Tl^{3+}$ for $Bi^{3+}$ shows a significantly larger bandgap reduction of ca. 0.8 eV, although the transition remains indirect (FIG. 8B). Calculations for other x values are shown in FIGS. 14A-14D and FIGS. 15A-15C. We also constructed a $Cs_2(Ag_{1-a}Bi_{1-b})Tl_xBr_6$ unit cell with 320 atoms in which we substituted $Tl^+$ and $Tl^{3+}$ at both $Ag^+$ and $Bi^{3+}$ sites ($Cs_2(Ag_{1-a}Bi_{1-b})Tl_xBr_6$ with a=0.03 and b=0.03). This leads to a bandgap reduction of ca. 0.6 eV and an indirect bandgap only ca. 0.1 eV smaller than the direct transition at Γ (FIGS. 16A-16C). The calculations for only $Tl^{3+}$ substitution and for mixed $T^+/Tl^{3+}$ substitution both agree well with our optical data.

Consolidating our experimental and theoretical results we offer a model to explain the possible changes in $Cs_2AgBiBr_6$'s electronic structure upon dilute Tl alloying. Initial introduction of $Tl^+$ produces defect levels derived from Tl $6s^2$ and $6p^0$ orbitals, while introduction of $Tl^{3+}$ affords defect levels stemming from Tl $5d^{10}$ and $6s^0$ orbitals. At low doping levels, this results in localized perturbations in the periodic lattice potential extending around the Tl impurity. As the Tl concentration increases, the average distance between Tl impurities rapidly diminishes. For example, at 0.1 atom % Tl (~$10^{19}$ atoms/$cm^3$) the average distance between Tl atoms is 3.3 nm or ca. 3 unit cells and the localized impurity states interact with each other and the host lattice to modify the band edges. For $Tl^{3+}$ substitution at $Bi^{3+}$, the average energy of the empty Tl s states is at lower energy than $Cs_2AgBiBr_6$'s CBM, resulting in a new band that reduces the bandgap. This new band has Tl s and Ag d character and is consequently similar to the highest VB of $Cs_2AgBiBr_6$, placing the CBM at L. Comparable bandgap narrowing has been observed for isovalent alloying of $GaAs_{1-x}N_x$ and $GaN_{1-x}Sb_x$.

Considering $Tl^+$ substitution at $Ag^+$, the average energy of the filled Tl s states is at higher energy than $Cs_2AgBiBr_6$'s VBM, also enabling a slight bandgap reduction. Additionally, $Tl^+$ substitution for $Ag^+$ introduces Tl p states at Γ that hybridize with Br p and Bi p orbitals, lowering the energy of the CBM at Γ and generating a direct gap. (FIG. 14B). For equal substitution at both Ag and Bi sites, the CBM is dominated by the lower-energy $Tl^{3+}$-derived s orbitals instead of the higher-energy $Tl^+$-derived p orbitals, which maintains the indirect bandgap.

Figure 17A:
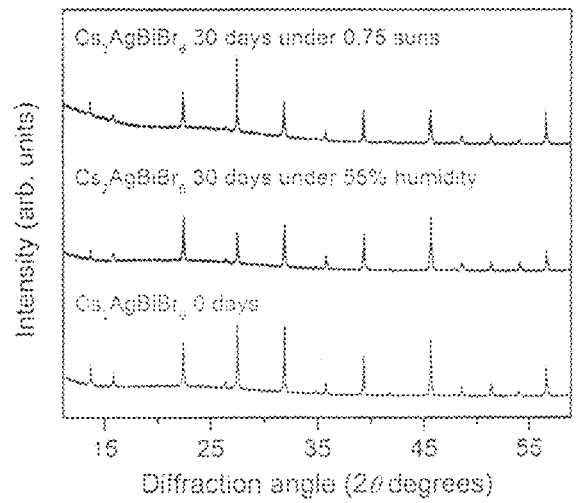
FIGS. 17A and 17B are graphs showing powder x-ray diffraction patterns of $Cs_2AgBiBr_6$ powder (FIG. 17A) and $Cs_2(Ag_{1-a}Bi_{1-b})Tl_xBr_6$ (with x=0.075) powder (FIG. 17B) after exposure to 55% relative humidity in the dark and 0.75 sun illumination under dry $N_2$ for 30 days.
Figure 17B:
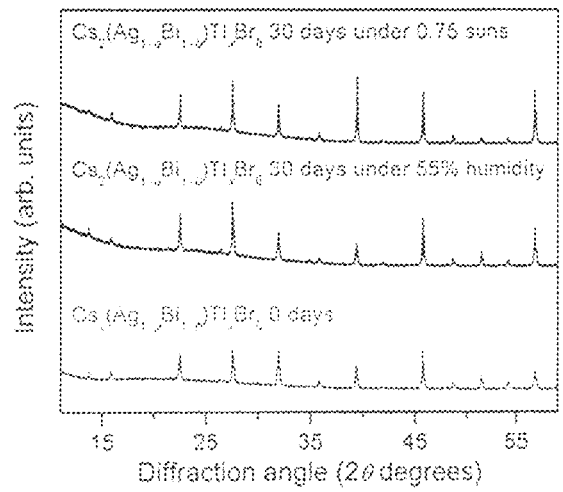
Figure 17C:
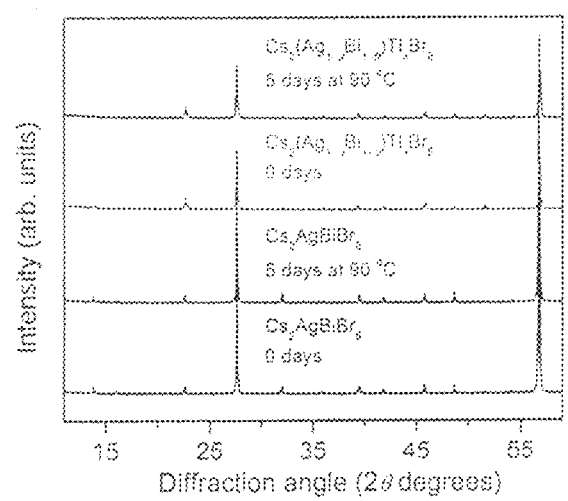
FIG. 17C is a graph showing the powder x-ray diffraction patterns of $Cs_2AgBiBr_6$ and $Cs_2(Ag_{1-a}Bi_{1-b})Tl_xBr_6$ after heating at 90° C. in air for 5 days.

Solid $Cs_2(Ag_{1-a}Bi_{1-b})Tl_xBr_6$ retains the stability displayed by $Cs_2AgBiBr_6$. Exposure to 0.75 sun at ca. 60° C. under $N_2$ for 30 days, 90° C. in air for 5 days (FIG. 17C), and 55% relative humidity under $N_2$ for 30 days resulted in no observable changes in PXRD patterns of $Cs_2(Ag_{1-a}Bi_{1-b})Tl_xBr_6$ (FIGS. 17A and 17B). Comparison of LD50 values shows that $Tl^+$ is ca. 10 times more toxic than $Pb^{2+}$. However, replacement of all the $Pb^{2+}$ in $APbX_3$ (20 atom %) with a small fraction of $Tl^+$ in the doped double perovskite (≤0.75 atom % in $Cs_2(Ag_{1-a}Bi_{1-b})Tl_xBr_6$) results in an overall decrease in toxicity.

EXPERIMENTAL METHODS

All manipulations were performed in air unless stated otherwise. All reagents were purchased from commercial sources and used as received. Solids $Cs_2AgBiBr_6$ and $Cs_3Tl_2Br_9$ were synthesized as previously reported. The compound $(MA)_2TlBiBr_6$ ($MA=CH_3NH_3^+$) has been previously synthesized under solvothermal conditions. Here, we report an alternative synthesis under ambient temperature and pressure.

Preparation of TlBr in HBr(aq)

To prepare a saturated, aqueous solution of TlBr in HBr (3.6(1) mM), TlBr beads (~50.0 mg, 0.176 mmol) were first soaked in 48 weight % HBr at 80° C. for 2 h. The solution was then cooled to room temperature, sonicated for 5 minutes, and filtered through glass microfiber filter paper. The solution was sonicated prior to filtering to prevent super saturation, which leads to TlBr contamination in the final products. The filtered solution was then diluted with HBr. Dilutions used in this study were 1%, 5%, 20%, 40%, 60%, and 100% of the volume fractions of the saturated TlBr solution. Fresh TlBr/HBr solutions were prepared for the syntheses of the double perovskites.

Synthesis of $Cs_2(Ag_{1-a}Bi_{1-b})Tl_xBr_6$ (x=a+b=0.003-0.075) Powders

To prepare bulk powders, 15 mL of the appropriately diluted TlBr/HBr solution was combined with 421 mg (0.938 mmol) $BiBr_3$, 176 mg (0.938 mmol) AgBr, and 400 mg (1.88 mmol) CsBr. Heating this mixture at 100° C. for ca. 2 h resulted in the complete dissolution of the solids leaving a clear yellow solution. The solution was then allowed to cool undisturbed overnight. This resulted in the formation of shiny black particles in the 100-500 μm size range. These particles were isolated by filtration through glass microfiber filter paper and washed several times with fresh HBr. Residual solvent was then removed under reduced pressure. Yields ranged from 396 mg (0.373 mmol, 39.8%) to 438 mg (0.412 mmol, 43.9%). The highest value for x corresponds to the saturated TlBr/HBr solution.

Synthesis of $Cs_2(Ag_{1-a}Bi_{1-b})Tl_xBr_6$ Single Crystals

To grow large (1-3 mm) single crystals of $Cs_2(Ag_{1-a}Bi_{1-b})Tl_xBr_6$ (x=a+b=0.003-0.075) the TlBr/HBr solution was prepared as before with the appropriate dilution. This solution (2 mL) was combined with $BiBr_3$ (57 mg, 0.13 mmol), AgBr (24 mg, 0.13 mmol), and CsBr (53 mg, 0.25 mmol) in a 4-mL vial. This vial was tightly sealed and then heated at 100° C. until the solids dissolved (ca. 2 h) to yield a clear yellow solution. The vial was then cooled to room temperature over 3 days at a rate of 1° C./hr. The solutions were left undisturbed at room temperature for an additional 12 h, as this tended to increase crystal size.

Synthesis of $(MA)_2TlBiBr_6$ and $(MA)_2(Tl_{1-a}Bi_{1-b})Ag_xBr_6$ (x=a+b)

Commercial sources of TlBr typically have large particle sizes and are slow to react. To shorten the reaction time finely divided TlBr was prepared as follows: Solid $Tl(PF_6)$ (160 mg, 0.458 mmol) and (TBA)Br (TBA=tetrabutylammonium) (221 mg, 0.686 mmol) were each dissolved separately in 3 mL of acetonitrile (MeCN) to afford clear colorless solutions. The (TBA)Br solution was then added dropwise to the $Tl(PF_6)$ solution under vigorous stirring, which instantaneously precipitated TlBr as a yellow solid. The suspension was filtered on glass microfiber filter paper and washed with fresh MeCN and diethylether. The yield was assumed to be quantitative and the TlBr solid was used immediately.

The TlBr was then added to 1 mL of concentrated HBr containing $BiBr_3$ (411 mg, 0.915 mmol), and (MA)Br (205 mg, 1.83 mmol). For $(MA)_2(Tl_{1-a}Bi_{1-b})Ag_xBr_6$ syntheses, AgBr (33 mg, 0.18 mmol) was also added to the HBr solution. The mixture was sonicated for 5 minutes to afford an orange-red solid, which turned deep red upon sitting undisturbed. After 1 h the solid was isolated by filtration on glass microfiber paper and the residual solvent was removed under reduced pressure. Yield: 298 mg solid (0.311 mmol, 67.9% relative to $TlPF_6$). Allowing the sonicated solution to sit undisturbed for 1 week at room temperature afforded red octahedral single crystals (ca. 50 μm) suitable for X-ray diffraction.

Optical and Vibrational Spectroscopy

Solid-state reflectance spectra were collected using a Cary 6000i spectrometer equipped with an integrating sphere in reflectance mode. Polycrystalline powders were attached to a glass slide with grease, which is transparent at energies below 3.0 eV. A glass slide covered with the same grease was used as a blank. The samples were center-mounted in the integrating sphere and angled 10° off normal incidence to prevent significant specular reflection from exiting the sphere. The obtained reflectance spectra were converted to pseudo-absorbance spectra using the Kubelka-Munk transformation (See below for more information).

Raman spectra were collected using a Renishaw RM1000 Raman microscope on isolated single crystals. The sample was excited at 514 nm using an Ar-ion laser with a power of 2.5 mW. Beam spot diameter was 50 smaller than the diameter of the crystal.

Optical Band-Gap Determination

The reflectance spectra we obtained were converted to pseudo-absorbance spectra using the Kubelka-Munk transformation:

$$\alpha \approx \frac{(1-R)^2}{2R}$$

where α=pseudo-absorbance and R=reflectance. Band gaps were extracted by fitting the linear regions of a plot of $\alpha^{1/2}$ vs. E for indirect or $\alpha^2$ vs. E for direct band gaps (where E=photon energy) and determining the x-intercepts. For an indirect band gap, absorption of photons with energies near the band gap must be coupled to phonon modes to conserve momentum. This gives the absorption coefficient the following dependence:

$$\alpha(E) = \alpha_e(E) + \alpha_a(E)$$

$$\alpha_e(E) = \frac{C(E - E_g + E_p)^2}{1 - \exp\left(\frac{-E_p}{kT}\right)}$$

$$\alpha_a(E) = \frac{C(E - E_g - E_p)^2}{\exp\left(\frac{E_p}{kT}\right) - 1}$$

Here, α=absorption coefficient, E=photon energy, $E_g$=band gap, $E_p$=phonon energy and C is a constant related to the carrier effective masses. The expressions for $\alpha_e$ and $\alpha_a$ represent transitions that correspond to the simultaneous absorption of a photon and emission of a phonon or the simultaneous absorption of both a photon and a phonon, respectively. Thus on a plot of $\alpha^{1/2}$ vs. E two linear regions are expected and the x-intercepts represent the values ($E_g - E_p$) and ($E_g + E_p$). The band gap can then be determined by averaging these two intercepts as $E_p$ is the same in both cases.

When large numbers of impurities are present (roughly $10^{18}$ cm$^{-3}$ or more) momentum may also be conserved by elastic scattering of electrons off impurities. This results in the following dependence:

$$\alpha(E) = C^* N(E - E_g)^2$$

where N=impurity concentration. This scattering mechanism would be expected to give only one linear region in a $\alpha^{1/2}$ vs. E plot and the x-intercept corresponds to the band gap.

For all the $Cs_2(Ag_{1-a}Bi_{1-b})Tl_xBr_6$ samples used in this study, we observe a single linear region in the $\alpha^{1/2}$ vs. E plot in contrast to the two linear regions observed in $Cs_2AgBiBr_6$ (See FIGS. 8A-8E). As our impurity concentrations for the Tl samples are all $10^{18}$ cm$^{-3}$ or greater this could either indicate an indirect band gap where momentum is conserved by impurity scattering as discussed above or a transition to a direct band gap. In the main text, we report both the direct and indirect band gaps obtained from our analysis.

Inductively Coupled Plasma (ICP) Analysis

ICP analysis of $Cs_2(Ag_{1-a}Bi_{1-b})Tl_xBr_6$ samples was performed by Huffman Hazen Laboratories (Golden, Colo.). Samples were digested and the concentrations of Ag, Bi, Cs, and Tl determined by atomic emission spectroscopy (ICP-AES) and mass spectrometry (ICP-MS). Due to the low solubility of Ag and Tl bromides the Br content could not be measured directly, but was inferred from the sum of the other masses. Measurements were run in duplicate and show good agreement. The compositions of each sample are given in Table 2 above. The concentration of Tl in the saturated TlBr in HBr solution was also determined by ICP-MS. Multiple samples consisting of a mixture of 2 mL of HBr and 50 mg of TlBr were heated at 80° C. for varying lengths of time from 30 min-24 h. The samples were then cooled, filtered through glass microfiber paper and 40 µL of the filtrate added to 7.46 mL of 1 vol. % $HNO_3$ solution for analysis. Measurements of each sample were performed in duplicate. All samples heated for longer than 2 h showed close agreement in Tl concentration suggesting that these samples had reached saturation. The saturated concentration of TlBr in 48 weight % HBr was determined to be 3.6(1) mM.

X-Ray Photoelectron Spectroscopy (XPS) and Sputtering Experiments

XPS measurements were performed on a PHI Versaprobe 1. Single crystal samples were mechanically and electronically contacted to a steel foil substrate with a graphite/isopropanol slurry. Survey scans were obtained with a pass energy of 117.4 eV. High-resolution scans were obtained of Tl-4f, Bi-5d, Ag-3d, Cs-3d, C-1s, and Br-3d signals using a pass energy of 23.5 eV. The crystal surface was sputtered with an Ar$^+$ ion gun over a 1 mm×1 mm area (larger than the crystal facet). The beam current was 1 µA and accelerator voltage was 2 kV. Sputtering was performed for a specific amount of time (typically 2 minutes) and then the material was allowed a 5-minute recovery period prior to measurement. Successive sputtering cycles were performed on the same spot in order to probe deeper into the crystal. Elemental quantification was performed using CasaXPS. The high-resolution scans of each element were fit using a mixture of Gaussian and Lorentzian functions and the area under the peak determined and compared with the total area under all the element peaks. There was some sample-to-sample variation, attributed to surface charging. Spectra were aligned using the carbon 1s peaks of native MA$^+$ and adventitious carbon.

X-Ray Absorption Spectroscopy (XAS) Experiments

XAS data were acquired at the Stanford Synchrotron Radiation Lightsource (SSRL) on beamline 2-2 at ambient temperature. Powder samples were diluted with boron nitride to two absorption lengths at the Tl-L3 edge (e$^{-2}$ transmission). All XAS data were measured simultaneously in transmission mode and with a Lytle fluorescence detector. Transmission data are reported for the standards $(MA)_2Tl^IBiBr_6$ and $Cs_3Tl^{III}{}_2Br_9$ (concentrated Tl condition) and fluorescence data are reported for $Cs_2(Ag_{1-a}Bi_{1-b})Tl_xBr_6$ (dilute Tl condition). In every scan, simultaneous transmission measurements were collected on a selenium reference foil. The spectra were analyzed using the Athena software package. Each Tl XAS spectrum was energy calibrated by assigning the inflection point on the Selenium rising edge to 12658 eV. The Tl spectra were then normalized by fitting the pre-edge region to a line and the post-edge to a cubic polynomial.

Crystal Structure Determination

Crystals of $Cs_2(Ag_{1-a}Bi_{1-b})Tl_xBr_6$, $(MA)_2TlBiBr_6$, and $(MA)_2(Tl_{1-a}Bi_{1-b})Ag_xBr_6$ were coated with Paratone-N oil, mounted on a Kapton® loop, and transferred to a Bruker D8 Venture diffractometer equipped with a Photon 100 CMOS detector. Frames were collected using ω and Ψ scans with 18-keV synchrotron radiation (λ=0.68880 Å) or Mo-kα radiation (λ=0.70930). Unit-cell parameters were refined against all data. The crystals did not show significant decay during data collection. Frames were integrated and corrected for Lorentz and polarization effects using SAINT 8.27b and were corrected for absorption effects using SADABS V2012. Space-group assignments were based upon systematic absences, E-statistics, agreement factors for equivalent reflections, and successful refinement of the structure. The structure was solved by direct methods, expanded through successive difference Fourier maps using SHELXT, and refined against all data using the SHELXL-2013 software package as implemented in Olex2. Weighted R factors, $R_w$, and all goodness-of-fit indicators are based on $F^2$. Thermal parameters for all inorganic components were refined anisotropically, while C and N atoms were refined isotropically due to MA's rotational disorder. Due to the high electron density present in the material it was deemed appropriate to apply an extinction correction (EXTI) to the refinements, which produced a significant improvement in the refinement indicators.

Similar to the structure of $(MA)_2TlBiBr_6$ the MA cation in $(MA)_2(Tl_{1-a}Bi_{1-b})Ag_xBr_6$ is rotationally disordered at room temperature, as required by the cubic symmetry of the structure. We have modelled this disorder using 6 different orientations of the molecule, 2 along each of the unit-cell axes. The disordered C and N atoms were refined isotropically with the C—N bond distance fixed at 1.5 Å and hydrogens were omitted from the structure due to the disorder.

Refinement of $(MA)_2(Tl_{1-a}Bi_{1-b})Ag_xBr_6$ with full Tl occupancy results in a large electron density hole at the Tl site (see FIG. S3). We modeled partial substitution of Ag at the Tl site and tied the occupancy to a free variable which refines to 20% Ag occupancy. To gain more confidence in our estimate of the Ag occupancy on the Ag/Tl site, we collected multiple datasets on the same crystal at different wavelengths (0.6888 Å, 0.9200 Å, 0.9791 Å, and 1.0500 Å) where the Tl anomalous scattering factors are very different from each other. All datasets are of high quality and result in full structure solutions with R1≈3% and wR2≈7%. The refined occupancy of Ag on the Ag/Tl site for the 4 datasets ranges from 20%-26% Ag with an estimated standard deviation (esd) of ca. 2%. As all of these values are within 3σ of each other, we assign the Ag occupancy as between 20%-26%. We have attempted to model Ag substitution at the Bi and Cs sites but the Ag occupancy refines to near zero and fails to improve the refinement. We have also considered the possibility that the missing electron density at the Tl site is due to Tl vacancies rather than the substitution of Ag. Allowing the Tl occupancy to refine freely results in a site-occupancy factor of 0.91 suggesting that ~10% of the Tl sites may be vacant. Given that 10% is an unusually high level of vacancies and that we can confirm the presence of Ag in $(MA)_2(Tl_{1-a}Bi_{1-b})Ag_xBr_6$ by observing characteristic Ag 3d signals in the XPS spectrum of these crystals (FIG. S1c), we consider the most likely possibility to be Ag substitution at the Tl site.

Likely owing to the much smaller Tl content in $Cs_2(Ag_{1-a}Bi_{1-b})Tl_xBr_6$ (compared to Ag content in $(MA)_2(Tl_{1-a}Bi_{1-b})Ag_xBr_6$), there were no obvious electron peaks or holes at any lattice site for a crystal of $Cs_2(Ag_{1-a}Bi_{1-b})Tl_xBr_6$ modeled as $Cs_2AgBiBr_6$, even when the dataset was collected on the Tl-L$^3$ edge, where sensitivity to Tl should be at a maximum. Attempts to refine partial occupancy of Tl on Cs, Bi, or Ag sites did not improve the refinement. The large amount of electron density in the host crystal combined with the small concentration of Tl (a maximum of 7.5% substitution at a single lattice site) means that indications of the presence of Tl fail to rise above the noise level.

Transient Microwave Conductivity Measurements

The time-resolved microwave conductivity technique was used to measure the change in the reflected microwave (f=8.5 GHz) power upon pulsed optical excitation of the samples. Single crystals of $Cs_2AgBiBr_6$ and $Cs_2(Ag_{1-a}Bi_{1-b})Tl_xBr_6$ (x=0.075) were glued to quartz substrates and placed in a sealed microwave cell within a nitrogen-filled glovebox. The samples were optically excited using laser pulses (3.5 ns width, repetition rate 10 Hz). In order to compare data collected at different wavelengths, the photoinduced normalized change in microwave power ($\Delta P/P$) was corrected for the number of incident photons per unit area ($I_0$). The rise of $\Delta P/P$ is limited by the response time of the microwave system (3 ns) and by the width of the laser pulses.

Stability Studies

Freshly synthesized dried powders of $Cs_2AgBiBr_6$ and $Cs_2(Ag_{1-a}Bi_{1-b})Tl_xBr_6$ with x=0.075 were attached to glass cover slips with a small amount of petroleum jelly. To test humidity stability, one sample each of $Cs_2AgBiBr_6$ and $Cs_2(Ag_{1-a}Bi_{1-b})Tl_xBr_6$ was suspended above a saturated $Mg(NO_3)_2$/water solution inside a sealed, dark-walled jar. The saturated salt solution maintained atmospheric moisture at 55% relative humidity. For the light-stability study, samples of $Cs_2AgBiBr_6$ and $Cs_2(Ag_{1-a}Bi_{1-b})Tl_xBr_6$ were placed in a homemade glass chamber and illuminated with a broad-spectrum halogen lamp. Dry $N_2$ gas was passed continuously over the samples. The light intensity at the sample surface was measured with a Si photodiode and determined to be ~0.75 sun. The sample temperature was not controlled but was periodically monitored and found to be 60-70° C. As previously observed, the light-exposed sample of $Cs_2AgBiBr_6$ showed noticeable surface darkening after ~15 days although no change was observed in the powder X-ray diffraction pattern. No visible changes occurred for the sample of $Cs_2(Ag_{1-a}Bi_{1-b})Tl_xBr_6$. For heat-stability studies, samples were placed on a hotplate, in air, and heated at 90° C. for 5 days. They were removed periodically to check for decomposition.

Computational Methods

Our density functional theory (DFT) calculations are performed within the generalized gradient approximation of Perdew, Burke, and Ernzerhof (PBE) and the projector augmented wave formalism (PAW) as implemented in the Vienna Ab initio Simulation Package (VASP). We treat 9 valence electrons explicitly for Cs ($5s^25p^66s^1$), 14 for Pb ($6s^25d^{10}6p^2$), 5 for Bi ($6s^26p^3$), 13 for Tl ($5d^{10}6s^26p^1$), 11 for Ag ($4d^{10}5s^1$), 7 for I ($5s^25p^5$) and 7 for Br ($4s^24p^5$). For the band structure calculations of the doped systems, we use a pseudopotential for Tl with only 3 valence electrons ($6s^26p^1$). We have tested for $(MA)_2TlBiBr_6$ that this changes the PBE+SOC band gap by only ~10 meV. Spin-orbit coupling is taken into account self-consistently. For the electronic structure calculations of the primitive unit cells of $(MA)PbI_3$, $Cs_2AgBiBr_6$ and $(MA)_2TlBiBr_6$ we perform Brillouin zone integrations on 6×6×6 Γ-centered k-point meshes, whereas for larger unit cells we use proportionally coarser k-grids, as well as a plane-wave cutoff of 500 eV such that total energy calculations are converged to within ~10 meV. It is well known that PBE underestimates fundamental band gaps of $(MA)PbI_3$ and similar materials by ~1 eV and more. We have therefore calculated the band structures of $Cs_2AgBiBr_6$ and $(MA)_2TlBiBr_6$ using the screened hybrid functional HSE06.[16] Table 3 below shows the resulting band gaps in comparison with PBE results and the measured (optical) band gaps. For $Cs_2AgBiBr_6$, the HSE06 band gap is 1.89 eV, in good agreement with experiment (1.95 eV) and $G_0W_0$ calculations (1.80 eV).[17] In the case of $(MA)_2TlBiBr_6$, however, HSE06 underestimates the experimental gap by more than 1 eV. Better agreement with experiment can be reached by performing GW calculations, which will be reported in a separate work.

We perform structural optimizations without SOC, relaxing all ions and the unit-cell volume without symmetry constraints until Hellmann-Feynman forces are less than 0.005 eV/Å. Calculated and experimental structural parameters can be found in Table 4 below. For $(MA)_2TlBiBr_6$ we replace MA by $Cs^+$ to avoid spurious and unphysical structural distortions caused by the strong coupling of the molecules' dipole moment with the inorganic $BiTlBr_6$ cage, similar to the case of $(MA)PbI_3$. We have tested that this replacement changes the band gap by less than 10 meV if the experimental structure of the inorganic lattice is kept fixed.

Furthermore, replacing MA by $Cs^+$ leads to fortuitously accurate lattice parameters due to the well-known overestimation of unit-cell volumes by PBE, which balances the slightly smaller volume of Cs as compared to MA. Both for $Cs_2AgBiBr_6$ and $(MA)_2TlBiBr_6$, band gaps calculated for experimental and relaxed structures are within 0.1 eV of each other. For consistency, we therefore report band gaps based on experimental structures (with MA replaced by Cs and internal coordinates relaxed for the doped systems) throughout this work.

For the doped structure with x=0.13, we tested two different Ag-substitution sites for the Tl dopant and found that the dopant position does not change the absolute values of, and the energy difference between, the direct and indirect band gap. Additionally, for the structure doped with two Tl atoms substituting for $Ag^+$ and $Bi^{3+}$, we have tested two different structural configurations: a) the two Tl dopant atoms occupy neighboring Ag and Bi sites, b) the two Tl dopant atoms occupy Ag and Bi sites that are as far apart from each other as possible. We find that the energy difference between these two configurations is only 1 meV/f.u. and the band structures are nearly identical with a difference in band gap of 0.03 eV. The Bader charges reported in Table 5 below were calculated using the Bader code for x=0.25 Tl substitution at each site.

The orbital character and indirect-direct band-gap transition of $Cs_2AgBiBr_6$ and $Cs_2(Ag_{1-a}Bi_{1-b})Tl_xBr_6$ can be understood based on symmetry considerations. Both compounds crystallize in structures with Fm-3m symmetry. In the idealized lattice, the Ag and Bi atoms occupy the (0, 0, 0) (Wyckoff position: 4a) and (0.5, 0.5, 0.5) (4b) positions, respectively; the Br atoms the (0.75, 0, 0) (24e) positions; and the Cs atoms the (0.25, 0.25, 0.25) (8c) positions. The conventional unit cell with its checkerboard Bi—Ag pattern, and the corresponding Brillouin zone are shown in FIG. 14A. Important high-symmetry points in reciprocal space are $\Gamma(0, 0, 0)$, $X(\pi/a, 0, \pi/a)$, and $L(\pi/a, \pi/a, \pi/a)$, where a is the lattice parameter in real space. The band structure of $Cs_2AgBiBr_6$ is typically calculated using the 10-atom primitive unit cell, and has an indirect band gap between X (VBM) and L (CBM). In FIG. 6C, however, we show the band structure of $Cs_2AgBiBr_6$ calculated using the 40-atom conventional unit cell, to facilitate comparison with the doped compounds. In this 40-atom conventional unit cell, the VBM appears at $\Gamma$ due to band folding. The VBM of $Cs_2AgBiBr_6$ is comprised of Ag $d_{z^2}$ character, which is hybridized with Br p and Bi s orbitals. Incorporation of Tl allows for further Tl s-Br p hybridization as illustrated schematically in FIG. 14B.

To calculate the band structure of a Tl-doped unit cell $Cs_2(Ag_{1-a}Bi_{1-b})Tl_xBr_6$ with x=0.03, we double the conventional unit cell in all directions. In the doubled unit cell, the reciprocal lattice vector is $b'=2\pi/2a=\pi/a$, and L corresponds to a full reciprocal lattice vector, leading to additional bands and a direct band gap at $\Gamma$, as shown in FIG. 14C for the pristine $Cs_2AgBiBr_6$ 2×2×2 unit cell. It also shows the energy differences corresponding to the indirect $\Gamma$-L (red arrow) and direct $\Gamma$-$\Gamma$ (black arrow) band gaps in the conventional unit cell. Substitution of one Ag atom by Tl in the doubled unit cell corresponds to $Cs_2(Ag_{1-a}Bi_{1-b})Tl_xBr_6$ with x=0.03. The bands at $\Gamma$ and L are marked with crosses in FIG. 14D. The orbital character of the bands is shown in color. The PBE+SOC band gap is 1.02 eV, only slightly smaller than that of $Cs_2AgBiBr_6$. Because of band folding associated with the 2×2×2 conventional cell, states with Ag s orbital character appear at $\Gamma$. Assuming that the Tl dopant constitutes only a small perturbation on the undoped system, these states are expected to be unfolded back to L, indicating an indirect band gap for $Cs_2(Ag_{1-a}Bi_{1-b})Tl_xBr_6$ when x=0.03. However, the difference between the indirect and the direct band gap is only ~0.1 eV. In contrast to the compounds with higher doping concentrations, there is no Tl s character in the VBM, and dispersion of Tl p states in the CBM is rather small, so that the energy of the CBM at $\Gamma$ does not drop sufficiently to induce a direct band gap; Assuming $Tl^+/Ag^+$ substitution, our DFT-PBE+SOC calculations predict the indirect to direct band gap transition to take place for Tl concentrations between x=0.03 and x=0.06.

TABLE 3

Experimental optical band gaps and fundamental calculated band gaps using the PBE and HSE06 functionals and the primitive unit cells.

|  | $Cs_2AgBiBr_6$ | $(MA)_2TlBiBr_6$ |
|---|---|---|
| Experimental | 1.95 | 2.16 |
| PBE + SOC | 1.09 | 0.52 |
| HSE06 + SOC | 1.89 | 1.04 |

TABLE 4

Structural parameters of $Cs_2AgBiBr_6$ and $(MA)_2TlBiBr_6$ calculated with DFT-PBE.

|  | $Cs_2AgBiBr_6$ | | $(MA)_2TlBiBr_6$ | |
|---|---|---|---|---|
|  | Experimental | PBE | Experimental | PBE |
| Space Group | Fm-3m | Fm-3m | Fm-3m | Fm-3m |
| a = b = c (Å) | 11.2499 | 11.4709 | 11.9173 | 12.0759 |
| $\alpha = \beta = \gamma$ (°) | 90 | 90 | 90 | 90 |
| Volume (Å$^3$) | 1423.79 | 1509.36 | 1692.52 | 1761.01 |
| Bi – Br (Å) | 2.822 | 2.878 | 2.829 | 2.873 |
| Ag – Br (Å) | 2.803 | 2.858 | n/a | n/a |
| Tl – Br (Å) | n/a | n/a | 3.129 | 3.165 |

TABLE 5

Bader charges for x = 0.25 in $Cs_2(Ag_{1-a}Bi_{1-b})Tl_xBr_6$ with Tl replacing Ag or Bi, calculated with DFT-PBE + SOC.

|  | Tl → Ag | Tl → Bi |
|---|---|---|
| Bi | +1.5 | +1.6 |
| Tl | +0.9 | +1.4 |
| Ag | +0.5 | +0.6 |
| Br | −0.3 | −0.1 |
| Cs | −0.2 | −0.7 |

Although semiconductor doping has played a central role in the photovoltaics industry, the effects of doping $APbX_3$ perovskites are only just being explored. The most pronounced effects have been seen in heavy alloying of (MA)$PbI_3$ with $Sn^{2+}$, where substitution of 25-50% of the $Pb^{2+}$ sites decreased the bandgap by ca. 0.4 eV,[18] and in doping $(MA)PbBr_3$ with $Bi^{3+}$ (substituting at 3.2% of the Pb sites), which resulted in a bandgap decrease of 0.3 eV.

Here we demonstrate that halide double perovskites have rich substitutional chemistry, which can engender dramatic changes to their photophysical properties. In the concentrated Tl regime, $Tl^+/Ag^+$ site mixing occurs readily, as in $(MA)_2(Tl_{1-a}Bi_{1-b})Ag_xBr_6$ $((MA)_2(Tl_{1-a}Bi_{1-b})Ag_xBr_6$, x=0.2). At lower Tl levels, $Tl^{3+}$ appears to predominantly substitute for $Bi^{3+}$ as in $Cs_2(Ag_{1-a}Bi_{1-b})Tl_xBr_6$ (x=0.075). Optical spectra reveal that the latter results in a bandgap decrease of ca. 0.5 eV. Calculations show that dilute $Tl^+$ alloying (x=0.06) at Ag$^+$ sites in Cs$_2$(Ag$_{1-a}$Bi$_{1-b}$)Tl$_x$Br$_6$ results in a 0.1-eV bandgap reduction and conversion to a direct gap, while Tl$^{3+}$ substitution at Bi$^{3+}$ sites affords a 0.8-eV reduction in bandgap, with the gap remaining indirect. Predominant substitution of Tl$^{3+}$ for Bi$^{3+}$ in Cs$_2$(Ag$_{1-a}$Bi$_{1-b}$)Tl$_x$Br$_6$ is most consistent with our experimental results.

The optoelectronic properties of Cs$_2$(Ag$_{1-a}$Bi$_{1-b}$)Tl$_x$Br$_6$ motivate the continued exploration of substitutional chemistry in double perovskites. Importantly, by describing how dopant orbitals at low concentrations selectively modify Cs$_2$AgBiBr$_6$'s band edges, we provide guidelines for identifying other dopants that can afford large bandgap reductions and direct-gap transitions in environmentally benign double perovskites.

Although the alloyed halide double perovskite material of the present disclosure and the associated cells and devices have been described in terms of illustrative embodiments, they are not limited thereto. Rather, the appended claims should be construed broadly to include other variants and embodiments of same, which may be made by those skilled in the art without departing from the scope and range of equivalents thereof.

What is claimed is:

1. A solar cell comprising a solar-cell absorber layer comprising a halide double perovskite material having a formula:

$$A_2B_{1-a}B'_{1-b}D_xX_6$$

where B and/or B' is alloyed by D to produce an alloyed halide double perovskite material, where A is an inorganic cation, an organic cation, a mixture of inorganic cations, a mixture of organic cations, or a mixture of one or more inorganic cations and one or more organic cations, where D is a dopant, where x=a+b, and where a is not equal to b when D is a single metal or a single metalloid, where X is a halide, a pseudohalide, a mixture of halides, a mixture of pseudohalides, or a mixture of halides and pseudohalides, and where B is a metal, a mixture of metals, a metalloid, a mixture of metalloids, or any mixture thereof, and B' is a metal, a mixture of metals, a metalloid, a mixture of metalloids, or any mixture thereof, or where B is a metal, a mixture of metals, a metalloid, a mixture of metalloids, or any mixture thereof, and B' is a vacancy, or where B' is a metal, a mixture of metals, a metalloid, a mixture of metalloids, or any mixture thereof, and B is a vacancy.

2. The solar cell of claim 1, wherein the dopant is Tl, In, Ga, Bi, Sb, As, Se, Te, Pb, Sn, Cu, Au, Zn, Cd, Hg, Sc, Y, Mn, Fe, K, Rb, Cs, Ca, Sr, Ba, La, Ti, Zr, Hf, Ag, Al, Ge, S, V, Nb, or any mixture thereof.

3. The solar cell of claim 1, wherein the alloyed halide double perovskite material is (MA)$_2$(Tl$_{1-a}$Bi$_{1-b}$)Ag$_x$Br$_6$, x=a+b=0.2.

4. The solar cell of claim 1, wherein the alloyed halide double perovskite material is Cs$_2$(Ag$_{1-a}$Bi$_{1-b}$)Tl$_x$Br$_6$ (x=a+b=0.003–0.075).

5. A composition comprising a halide double perovskite material having a formula:

$$A_2B_{1-a}B'_{1-b}D_xX_6$$

where B and/or B' is alloyed by D to produce an alloyed halide double perovskite material, where A is an inorganic cation, an organic cation, a mixture of inorganic cations, a mixture of organic cations, or a mixture of one or more inorganic cations and one or more organic cations, where D is a dopant, where x=a+b, and where a is not equal to b when D is a single metal or a single metalloid, where X is a halide, a pseudohalide, a mixture of halides, a mixture of pseudohalides, or a mixture of halides and pseudohalides, and where B is a metal, a mixture of metals, a metalloid, a mixture of metalloids, or any mixture thereof, and B' is a metal, a mixture of metals, a metalloid, a mixture of metalloids, or any mixture thereof, or where B is a metal, a mixture of metals, a metalloid, a mixture of metalloids, or any mixture thereof, and B' is a vacancy, or where B' is a metal, a mixture of metals, a metalloid, a mixture of metalloids, or any mixture thereof, and B is a vacancy.

6. The composition of claim 5, wherein the dopant is Tl, In, Ga, Bi, Sb, As, Se, Te, Pb, Sn, Cu, Au, Zn, Cd, Hg, Sc, Y, Mn, Fe, K, Rb, Cs, Ca, Sr, Ba, La, Ti, Zr, Hf, Ag, Al, Ge, S, V, Nb, or any mixture thereof.

7. The composition of claim 5, wherein the alloyed halide double perovskite material is (MA)$_2$(Tl$_{1-a}$Bi$_{1-b}$)Ag$_x$Br$_6$, x=a+b=0.2.

8. The composition of claim 5, wherein the alloyed halide double perovskite material is Cs$_2$(Ag$_{1-a}$Bi$_{1-b}$)Tl$_x$Br$_6$ (x=a+b=0.003–0.075).

9. A solar absorber for a photovoltaic cell, the solar absorber comprising a halide double perovskite material having a formula:

$$A_2B_{1-a}B'_{1-b}D_xX_6$$

where B and/or B' is alloyed by D to produce an alloyed halide double perovskite material, where A is an inorganic cation, an organic cation, a mixture of inorganic cations, a mixture of organic cations, or a mixture of one or more inorganic cations and one or more organic cations, where D is a dopant, where x=a+b, and where a is not equal to b when D is a single metal or a single metalloid, where X is a halide, a pseudohalide, a mixture of halides, a mixture of pseudohalides, or a mixture of halides and pseudohalides, and where B is a metal, a mixture of metals, a metalloid, a mixture of metalloids, or any mixture thereof, and B' is a metal, a mixture of metals, a metalloid, a mixture of metalloids, or any mixture thereof, or where B is a metal, a mixture of metals, a metalloid, a mixture of metalloids, or any mixture thereof, and B' is a vacancy, or where B' is a metal, a mixture of metals, a metalloid, a mixture of metalloids, or any mixture thereof, and B is a vacancy.

10. The solar absorber of claim 9, wherein the dopant is Tl, In, Ga, Bi, Sb, As, Se, Te, Pb, Sn, Cu, Au, Zn, Cd, Hg, Sc, Y, Mn, Fe, K, Rb, Cs, Ca, Sr, Ba, La, Ti, Zr, Hf, Ag, Al, Ge, S, V, Nb, or any mixture thereof.

11. The solar absorber of claim 9, wherein the alloyed halide double perovskite material is (MA)$_2$(Tl$_{1-a}$Bi$_{1-b}$)Ag$_x$Br$_6$, x=a+b=0.2.

12. The solar absorber of claim 9, wherein the alloyed halide double perovskite material is $Cs_2(Ag_{1-a}Bi_{1-b})Tl_xBr_6$ (x=a+b=0.003–0.075).

\* \* \* \* \*